(12) United States Patent
Nishi et al.

(10) Patent No.: US 8,553,464 B2
(45) Date of Patent: Oct. 8, 2013

(54) NONVOLATILE PROGRAMMABLE LOGIC SWITCH

(75) Inventors: Yoshifumi Nishi, Kanagawa-ken (JP);
Daisuke Hagishima, Kanagawa-ken (JP); Shinichi Yasuda, Tokyo (JP);
Tetsufumi Tanamoto, Kanagawa-ken (JP); Takahiro Kurita, Kanagawa-ken (JP); Atsuhiro Kinoshita, Kanagawa-ken (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 13/240,087

(22) Filed: Sep. 22, 2011

(65) Prior Publication Data
US 2012/0243336 A1 Sep. 27, 2012

(30) Foreign Application Priority Data

Mar. 24, 2011 (JP) ................................ P2011-065269

(51) Int. Cl.
*G11C 11/35* (2006.01)
(52) U.S. Cl.
USPC ............. 365/185.27; 365/185.05; 365/185.18
(58) Field of Classification Search
USPC ........................... 365/185.27, 185.05, 185.18
See application file for complete search history.

(56) References Cited

U.S. PATENT DOCUMENTS

| 5,812,450 | A | 9/1998 | Sansbury et al. |
| 6,002,610 | A | 12/1999 | Cong et al. |
| 6,222,774 | B1 * | 4/2001 | Tanzawa et al. ......... 365/185.29 |
| 7,697,336 | B2 * | 4/2010 | Jeon et al. ............... 365/185.18 |
| 7,705,388 | B2 * | 4/2010 | Iwata ............................ 257/314 |

FOREIGN PATENT DOCUMENTS

JP 2011-185773 9/2011

* cited by examiner

*Primary Examiner* — Son Dinh
(74) *Attorney, Agent, or Firm* — Finnegan, Henderson, Farabow, Garrett & Dunner, L.L.P.

(57) ABSTRACT

An aspect of the present embodiment, there is provided a nonvolatile programmable logic switch including a first memory cell transistor, a second memory cell transistor, a pass transistor and a first substrate electrode applying a substrate voltage to the pass transistor, wherein a writing voltage is applied to the first wiring, a first voltage is applied to one of a second wiring and a third wiring and a second voltage which is lower than the first voltage is applied to the other of the second wiring and the third wiring, and the first substrate voltage which is higher than the second voltage and lower than the first voltage is applied to a well of the pass transistor, when data is written into the first memory cell transistor or the second memory cell transistor.

9 Claims, 25 Drawing Sheets

US 8,553,464 B2

NONVOLATILE PROGRAMMABLE LOGIC SWITCH

CROSS REFERENCE TO RELATED APPLICATION

This application is based upon and claims the benefit of priority from prior Japanese Patent Application No. 2011-065269, filed on Mar. 24, 2011, the entire contents of which are incorporated herein by reference.

FIELD

Embodiments described herein generally relate to a nonvolatile programmable logic switch.

BACKGROUND

Programmable logic switches are devices to control on and off of a logic switch such as a transistor, for example, in accordance with data stored in a memory. Such programmable logic switches are generally used in Field Programmable Gate Arrays (FPGAs) and the like which require reconfiguration of an arithmetic logic circuit and a wiring circuit.

A volatile memory such as an SRAM is used in a programmable logic switch used for a FPGA. Data stored in an SRAM are lost when the power is turned off. Accordingly, programmable switches using a volatile memory have a problem that data needs to be read again from a separately-provided memory region when the power is supplied again.

In general, an SRAM is formed of six transistors. For this reason, FPGAs including a large number of SRAMs have a problem of being large in chip area.

DETAILED DESCRIPTION

Figure 1:
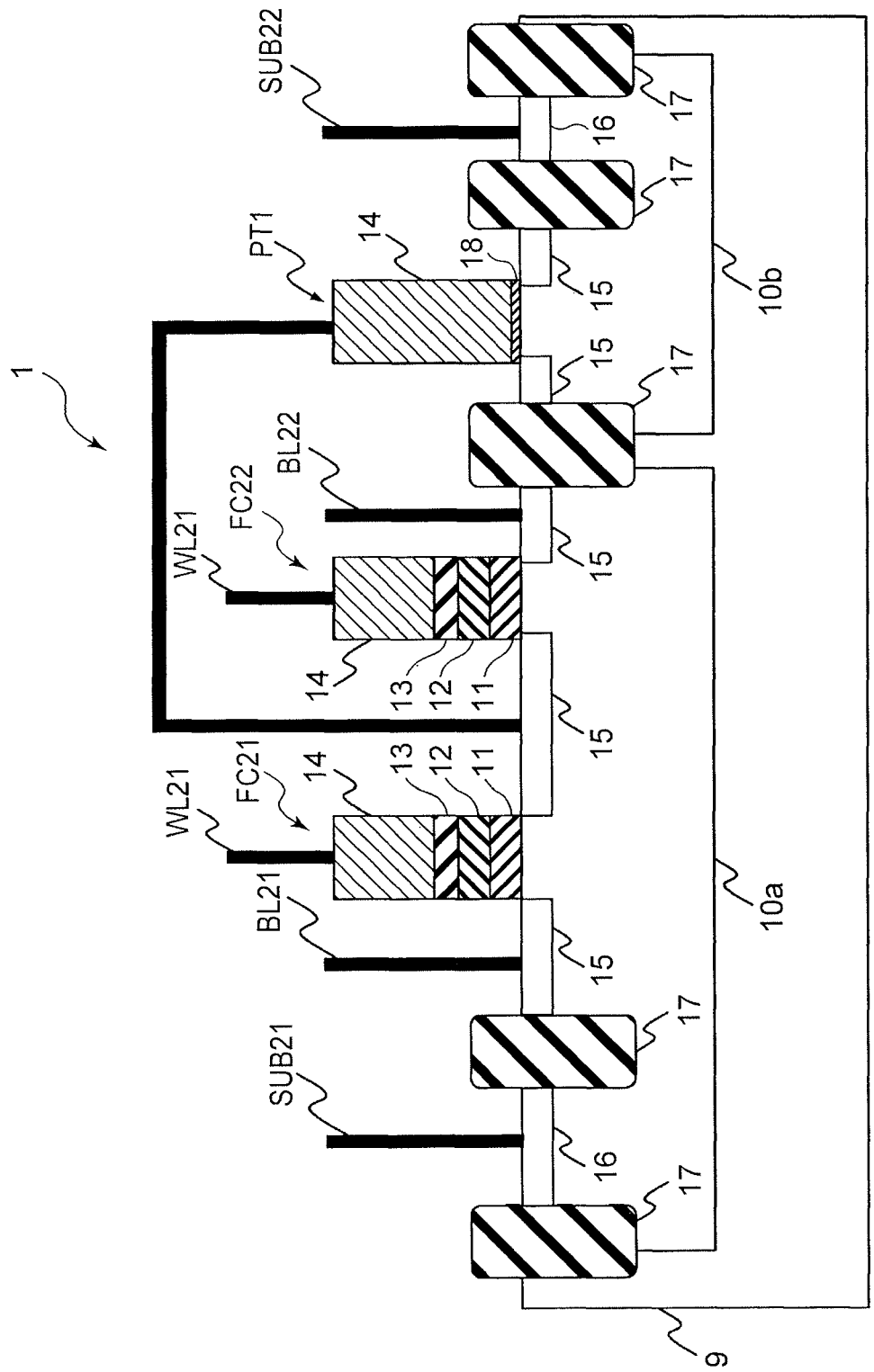
FIG. 1 is a cross-sectional diagram showing a logic switch according to a first embodiment.

An aspect of the present embodiment, there is provided a nonvolatile programmable logic switch including a first memory cell transistor including a first charge accumulation film, a first control gate connected to a first wiring and first and second source-drains, where a first end of the first source-drain being connected to a second wiring, a second memory cell transistor including a second charge accumulation film, a second control gate connected to the first wiring and third and fourth source-drains, where a third end of the third source-drain being connected to a second end of the second source-drain of the first memory cell transistor, a fourth end of the fourth source-drain being connected to a third wiring, a pass transistor including a gate electrode connected to the second end of the second source-drain of the first memory cell and the third end of the third source-drain of the third memory cell, and a first substrate electrode applying a first substrate voltage to a first well of the pass transistor, wherein a writing voltage is applied to the first wiring, a first voltage is applied to one of the second wiring and the third wiring and a second voltage which is lower than the first voltage is applied to the other of the second wiring and the third wiring, and the first substrate voltage which is higher than the second voltage and lower than the first voltage is applied to the first well of the pass transistor, when data is written into the first memory cell transistor or the second memory cell transistor.

Prior to describing embodiments, an idea of the application will be described.

First, conventional techniques will be described.

A conventional integrated circuit has a structure that gates of two nonvolatile transistors, for example, are connected with a control voltage line, which is a common wiring line, and an equal voltage is applied to the gates. In writing to a first nonvolatile transistor, a positive voltage is applied to the control voltage line, a positive voltage is further applied to a program data high line (PDH), which is a wiring line, for example, and an access transistor connected to an output node Q is thereby turned on, while the output node is grounded. In this way, hot electrons are generated at a drain end of the first nonvolatile transistor, and electric charges are injected into the first nonvolatile transistor. Here, when a program data low line (PDL), which is a wiring line, is grounded, no hot electrons are generated in a second nonvolatile transistor, and hence no electric charges are injected into the second nonvolatile transistor.

In this method, the hot electrons generated at the drain end of the first nonvolatile transistor need to inject into a charge accumulation layer by overcoming an energy barrier of an insulating film. For this reason, a voltage equal to or above the barrier of the insulating film is applied to the wiring line PDH.

In the case where a semiconductor substrate is made of Si and an insulating film is made of SiO2, for example, a voltage of approximately 2 V or above is required. When a flash memory cell of another logic switch sharing the wiring line PDH is in an ON state, the voltage from the wiring line PDH is input to a gate of a pass transistor connected to the output node Q. The pass transistor is formed of a high-performance transistor used as a logic element. When a voltage of 2 V or above is applied to the pass transistor having a drive voltage of 1.5 V or below, an insulating film may be destroyed. Hence, such a conventional technique has a probability that the pass transistor may be damaged.

Descriptions will be given of a case of using MONOS transistors having a process consistency with logic transistors to reduce the chip area and simplify the circuit when a programmable logic switch includes embedded memory cell transistors and logic transistors with high packing density.

In a conventional method of erasing data in a nonvolatile transistor, a negative voltage is applied to a control voltage line, a voltage is applied to an address line, which is a wiring line connected with a gate of an access transistor, and the access transistor is thereby turned on. As a result, a voltage is applied to an output node Q from a reference voltage line, which is a wiring line. Then, a high electric field occurs at a drain end, on the output node Q side, of each of a first nonvolatile transistor and a second nonvolatile transistor. Consequently, electrons are derived out from floating gates to the output node Q side, and thereby data are erased.

However, when such a method of erasing data described in the conventional technique is applied to a programmable logic switch using MONOS transistors, data may not be erased.

In a floating gate transistor, electric charges can move freely in a charge accumulation layer. By contrast, in a memory cell transistor using a charge accumulation insulating film, such as a MONOS transistor, electric charges are less likely to move in the charge accumulation film. As a result, data are erased only locally, and data in the entire charge accumulation film are difficult to be erased. In addition, since a negative voltage is applied, a negative voltage generation circuit is required, increasing the chip area. Furthermore, such an erasing method is not suitable in the case of aiming at reducing the device size of a short-channel device, in which an electric field at a drain affects even a source end, because an electric field is hardly concentrated at the drain end.

In consideration of the above-described knowledge, the applicants succeeded in obtaining a nonvolatile programmable logic switch which can be reduced in size as much as possible. The nonvolatile programmable logic switch will be described below as embodiments.

First Embodiment

Figure 2:
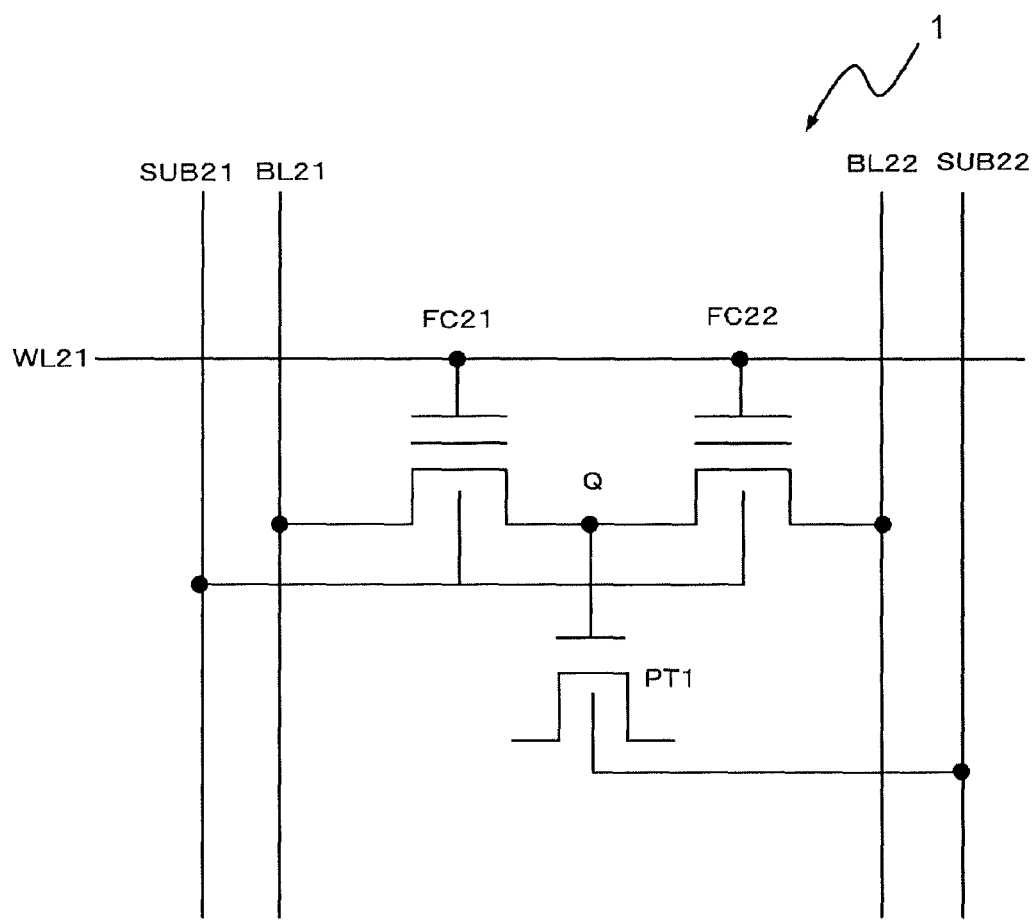
FIG. 2 is a circuit diagram showing the logic switch according to the first embodiment.

With reference to FIG. 1 and FIG. 2, a nonvolatile programmable logic switch (also simply referred to as a logic switch, below) according to a first embodiment will be described. FIG. 1 is a cross-sectional diagram of a logic switch 1 according to the first embodiment. FIG. 2 is a cross-sectional diagram of the logic switch 1.

As shown in FIG. 1, wells 10a, 10b are formed in a silicon substrate 9 in the logic switch 1, and memory cell transistors FC21, FC22 are provided on the same well 10a. The memory cell transistors FC21, FC22 are MONOS transistors, and each has a gate structure including, from the silicon substrate side, a silicon oxide film (tunnel film) 11, a silicon nitride film (charge accumulation insulating film) 12, a silicon oxide film (block film) 13 and a metal electrode 14, in this order. A MONOS transistor is a nonvolatile memory which maintains data by trapping electric charges in a charge-trapping site of a silicon nitride film. The metal electrode may be replaced with silicon containing high-concentration impurity. In such a case, the transistor is called a SONOS transistor. Alternatively, a floating gate transistor may be used.

As shown in FIG. 1 and FIG. 2, gates of the memory cell transistors FC21, FC22 are both connected to a wiring line WL21. One of source-drain electrodes 15 of the memory cell transistor FC21 is connected to a wiring line BL21 while the other is connected to one of source-drain electrodes of the memory cell transistor FC22. The other of the source-drain electrodes 15 of the memory cell transistor FC22 is connected to a wiring line BL22. Connection nodes of the memory cell transistors FC21, FC22 are connected to a gate of a pass transistor PT1.

Further, a substrate electrode 16 is formed in the well 10a, on which the memory cell transistors FC21, FC22 are formed. The substrate electrode 16 for the memory cell transistors FC21, FC22 are connected to a wiring SUB21. With this configuration, a substrate voltage is applied to the memory cell transistors FC21, FC22 through the wiring SUB21.

The pass transistor PT1 is formed on the well 10b formed in the substrate, and outputs from the connection nodes of the memory cell transistors FC21, FC22 are input to the gate of the pass transistor PT1. A substrate electrode 16 is also provided in the well 10b, and is connected to a wiring SUB22. With this configuration, a substrate voltage is applied to the pass transistor PT1 through the wiring SUB22.

In the embodiment, descriptions are given of a case where the memory cell transistors FC21, FC22 are N-type MOS transistors formed on a P-type well. The memory cell transistors FC21, FC22 may, however, be P-type MOS transistors formed on an N-type well. In FIG. 1, the memory cell transistors FC21, FC22 are formed in the same active area (referred to as an AA in short, below) surrounded by device isolations 17. However, the memory cell transistors FC21, FC22 may be formed in different AAs. The substrate may be a semiconductor substrate other than a silicon substrate.

The logic switch according to the embodiment turns one of the memory cell transistors FC21, FC22 into a writing state as appropriate. The memory cell transistor FC21 or FC22 being in a programmed state (a state where electric charges are stored in the charge accumulation insulating film) determines an ON/OFF state (a conducting/non-conducting state) of each of the memory cell transistors FC21, FC22. Specifically, one of the memory cell transistors FC21, FC22 is turned into an ON state while the other is turned into an OFF state. The source-drain electrode of one of the memory cell transistors FC21, FC22 is connected to a drive voltage supply while the source drain electrode of the other is connected to a ground line having an electric potential of 0 V. With this configuration, when the memory cell transistor connected to the drive voltage supply is in an ON state, a drive voltage is applied to the gate of the pass transistor PT1, and the pass transistor PT1 is thereby turned into an ON state. When the memory cell transistor connected to the ground line is in an ON state, on the other hand, 0 V is applied to the gate of the pass transistor PT1, and the pass transistor PT1 is thereby turned into an OFF state.

In a case where a logic switch is formed by using a single memory cell transistor and connecting a gate of a pass transistor to the memory cell transistor, different from the embodiment, a state in which a drive voltage is applied to the pass transistor and a state in which a drive voltage is not applied to the pass transistor are switched by turning the memory cell transistor on/off. In the case of this logic switch, however, when the memory cell transistor is in an OFF state, the gate of the pass transistor is cut out from the others and comes to be in a floating state. Accordingly, the electric potential may be unstable due to an effect of a logic signal passing the pass transistor, which may cause a malfunction of the pass transistor. By contrast, in a case where the two memory cell transistors FC21, FC22 are used as in the embodiment, since either a drive voltage or 0 V can be applied to the pass transistor PT1, such a malfunction cased by gate floating of the pass transistor PT1 does not occur.

Next, methods of writing and erasing data to and from a logic switch according to the embodiment will be described.

Figure 3:
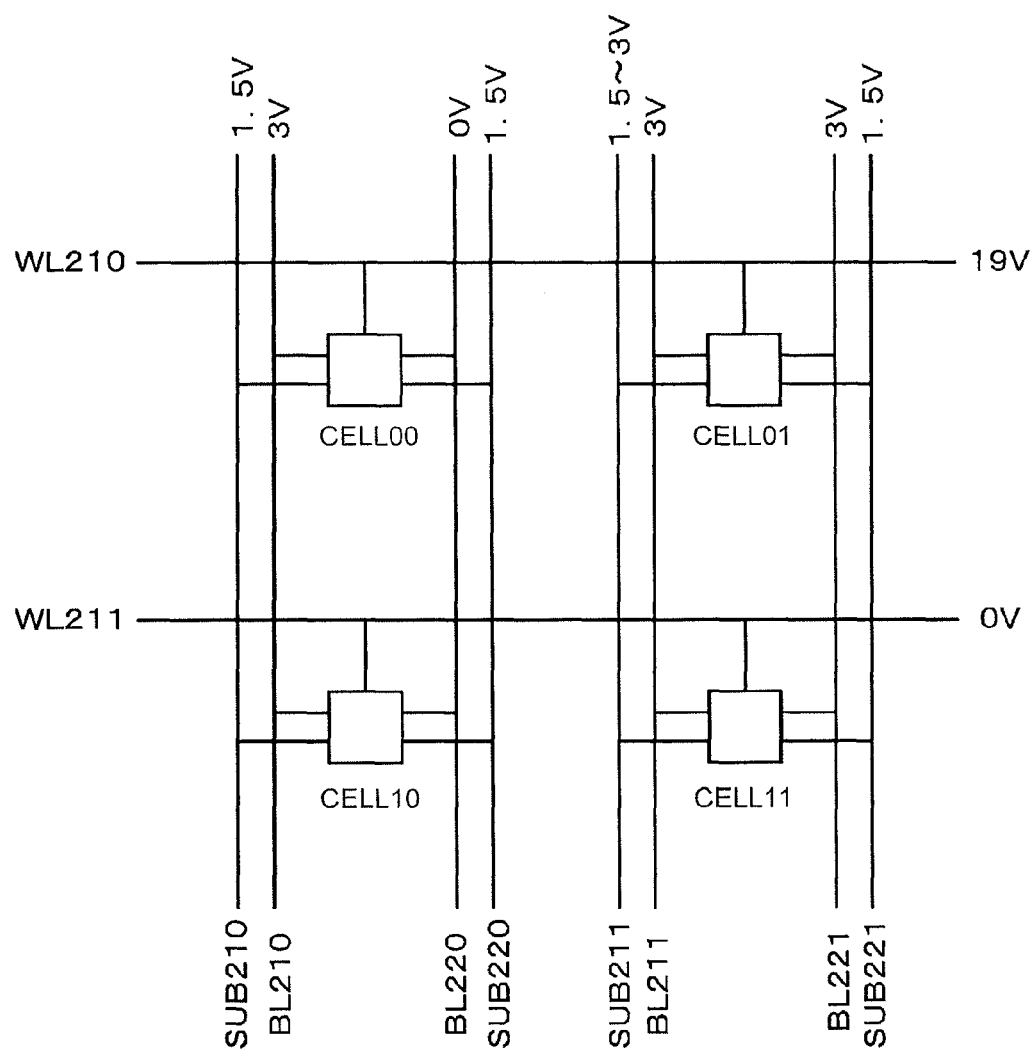
FIG. 3 is a circuit diagram showing a switch array using the logic switches according to the first embodiment.

FIG. 3 shows a switch array in which logic switches shown in FIG. 2 are arranged in an array. Each of cells 00, 01, 10, 11 in FIG. 3 corresponds to the logic switch shown in FIG. 2. Gates of memory cell transistors included in the cells 00, 01 are connected to a same wiring WL210. Gates of memory cell transistors included in the cells 10, 11 are connected to a wiring WL211. Moreover, common wiring lines are used for the cells 00, 10. Such common wiring lines are wirings BL210, BL220 to which source drain electrodes of corresponding memory cell transistors are connected, or wirings SUB210, SUB220 to which substrate electrodes are connected, for example. Common wirings are also used for the cells 01, 11. Such common wirings are wirings BL211, BL221 to which source drain electrodes of corresponding memory cell transistors are connected, or wirings SUB211, SUB221 to which substrate electrodes are connected, for example. To write data to the cell 00 of the switch array thus configured, voltages shown in FIG. 3, for example, are applied to the wirings of the switch array, respectively.

Figure 4:
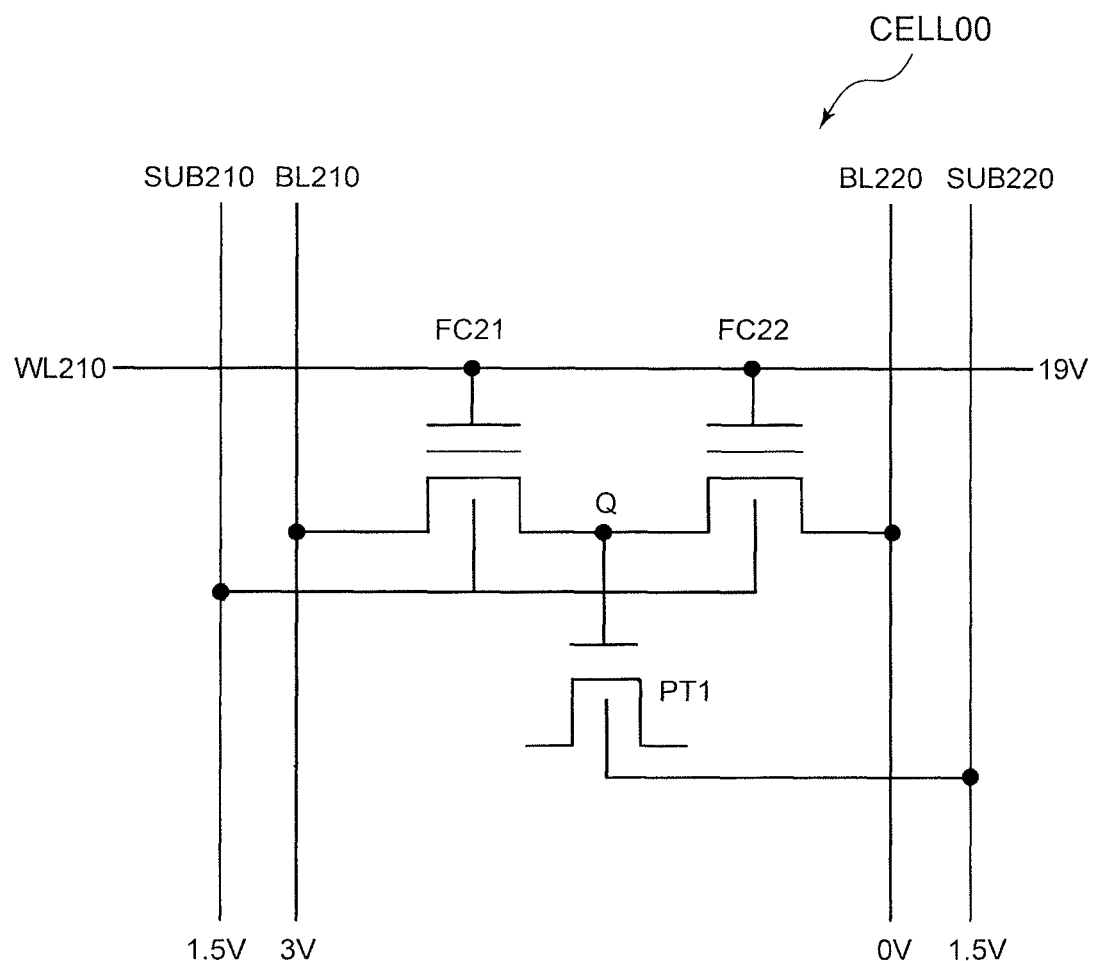
FIG. 4 is a circuit diagram showing a cell 00 in the switch array using the logic switches according to the first embodiment.

FIG. 4 shows a case in which the cell 00 of the switch array in FIG. 3 is a selection cell to which data are to be written. A high voltage of 19 V is applied to the wiring line WL210, to which gates of memory cell transistors FC21, FC22 of the cell 00 are connected. A voltage of 3 V is applied to the wiring BL210, to which one of source-drains of the memory cell transistor FC21 is connected, while a voltage of 0 V is applied to the wiring line BL220, to which one of source-drains of the memory cell transistor FC22 is connected. A voltage of 1.5 V is applied to the wiring SUB210, to which the substrate electrode of the memory cell transistors FC21, FC22 is connected, while a voltage of 1.5 V is applied to the wiring SUB220, to which a substrate electrode of a pass transistor PT1 is connected.

The voltage of 19 V applied to the wiring WL210 is high enough to turn the memory cell transistors FC21, FC22 into an ON state. Accordingly, electrical current flows from the wiring BL210 to the wiring BL220. When a voltage is applied to the wiring WL210, the timings at which the memory cell transistors FC21, FC22 are turned into an ON state are shifted, and thereby one of the memory cell transistors FC21, FC22 is turned into an ON state while the other is turned into an OFF state, in some cases. In such a case, a voltage of a minimum of 0 V to a maximum of 3 V is applied to a connection node Q as a voltage applied to the wiring BL210 and the wiring BL220, respectively. The pass transistor PT1 is formed of a high-performance transistor used as a logic element. When a voltage of 2 V or above is applied to the pass transistor PT1 having a drive voltage of 1.5 V or below, the pass transistor PT1 may be destroyed. To prevent this phenomenon, a substrate voltage (1.5 V) equivalent to approximately half of the maximum voltage to be applied to the connection node Q is applied to the pass transistor PT1 through the wiring SUB220. With this application, the voltage applied to a gate insulating film of the pass transistor PT1 results in 1.5 V at maximum substantially. Since 1.5 V is below the breakdown voltage of a logic transistor, the gate insulating film of the pass transistor PT1 is not damaged.

Upon application of the voltage to the wiring WL210, the memory cell transistors FC21, FC22 are both turned into an ON state. In this process, since potential drop principally occurs in channels of the memory cell transistors, a voltage applied to a tunnel film of the memory cell transistor FC22 results in being approximately 3 V higher than that applied to a tunnel film of the memory cell transistor FC21. By using the difference between the voltages applied to the tunnel films, it is possible to turn only the memory cell transistor FC22 into a writing state without turning the memory cell transistor FC21 into a writing state.

Figure 8:
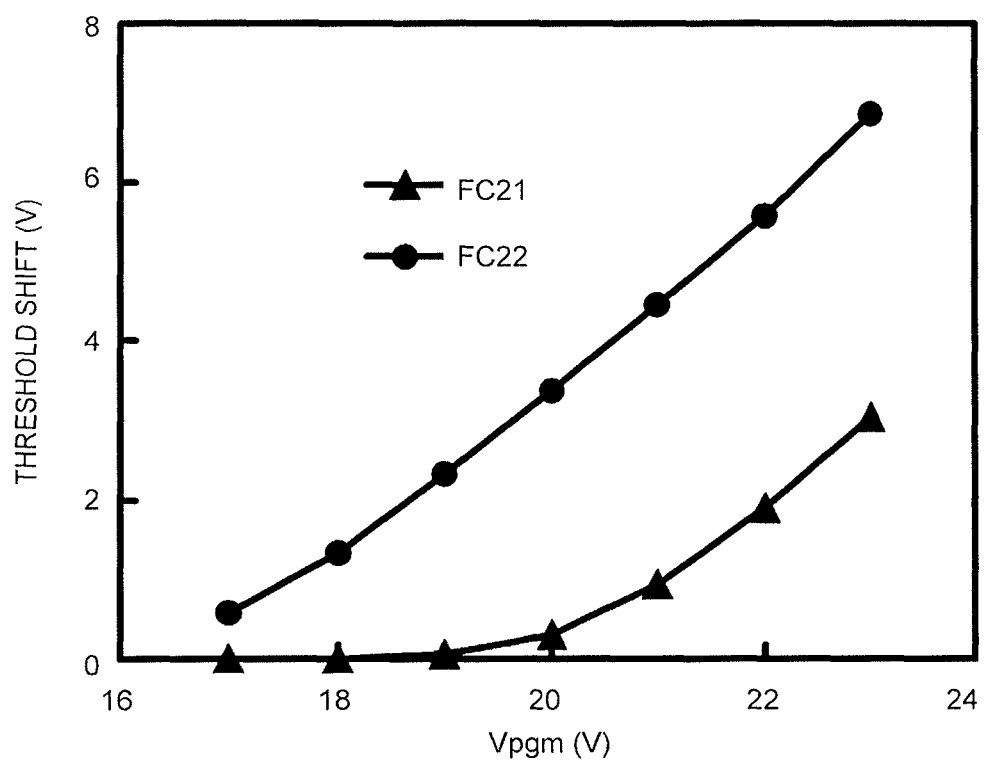
FIG. 8 is a chart showing threshold voltage shifts when write voltages are supplied to gates of memory cell transistors according to the first embodiment.

FIG. 8 shows shifts in threshold voltage when writing voltages (program voltages) Vpgm are applied to the gates of the memory cell transistors FC21, FC22 each having a tunnel film thickness tox of 7.9 nm and a block film thickness tipd of 12.2 nm. As shown in FIG. 8, when a voltage around 18-19 V is applied to the gates of both memory cell transistors FC21, FC22, data are written to the memory cell transistor FC22, and the threshold voltage shifts. Since data are not written to the memory cell transistor FC21, on the other hand, the threshold voltage does not shift. In addition, the difference in threshold voltage between the memory cell transistors FC21, FC22 reaches 3 V in this step, and hence a voltage which is higher than the threshold voltage of the memory cell transistor FC21 and is lower than the threshold voltage of the memory cell transistor FC22 is applied to the gates of both memory cell transistors FC21, FC22. Consequently, a window large enough for practical application to turn only the memory cell transistor FC22 into an ON state is obtained.

The voltage to be applied to the gates of the memory cell transistors FC21, FC22 from the wiring WL210 is adjusted to a level which causes a shift in threshold voltage of only one of the memory cell transistors FC21, FC22. In this way, data can be written to only one of the memory cell transistors FC21, FC22.

In the embodiment, descriptions have been given of a case in which only the memory cell transistor FC22 is turned into a programmed state. It is also possible to turn only the memory cell transistor FC21 into a writing state. To turn the memory cell transistor FC21 into a programmed state while turning the memory cell transistor FC22 into a non-programmed state, a voltage which is higher than that applied to the wiring line BL210 connected to the memory cell transistor FC21 is applied to the wiring line BL220 connected to the memory cell transistor FC22. Voltages of 0 V and 3 V are applied respectively to the wiring lines BL210, BL220, for example.

Figure 5:
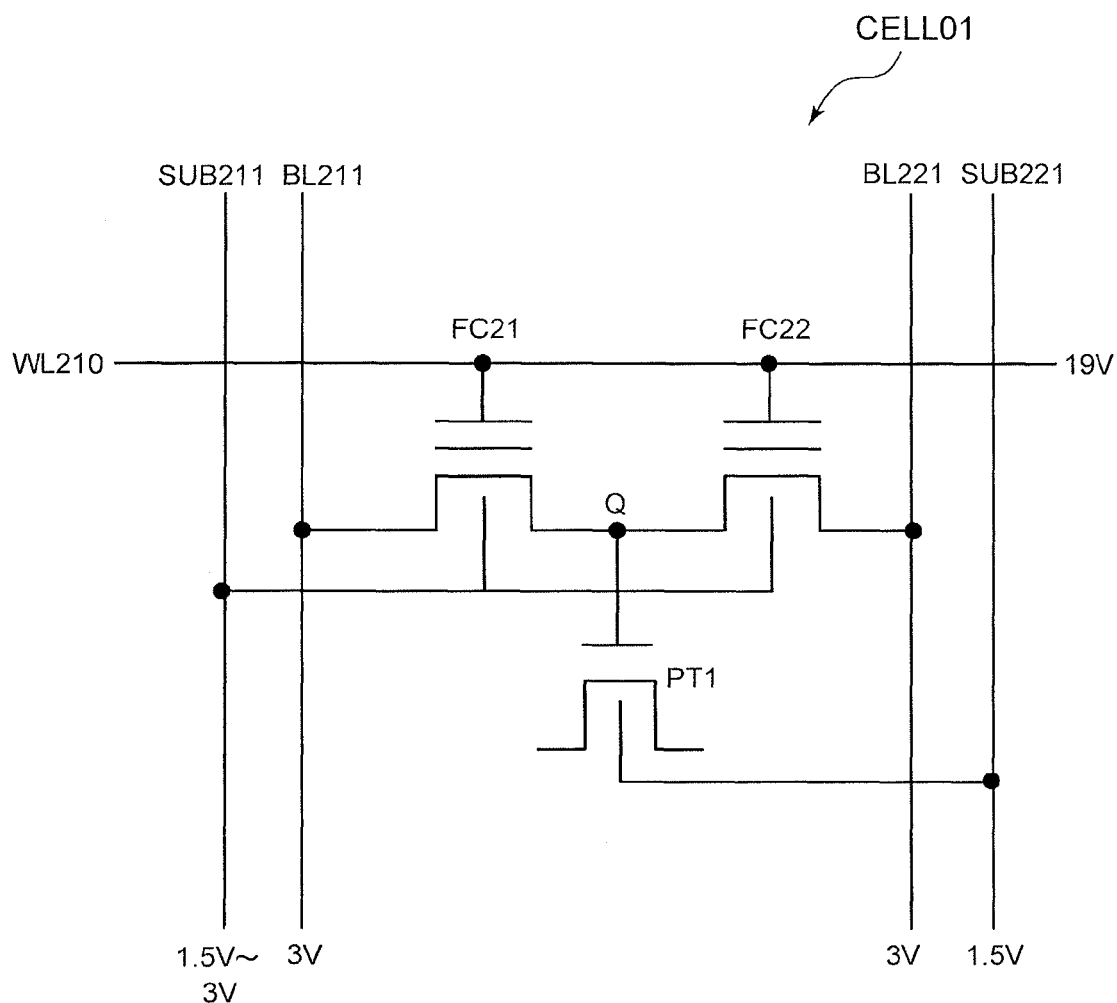
FIG. 5 is a circuit diagram showing a cell 01 in the switch array using the logic switches according to the first embodiment.

FIG. 5 shows the cell 01 of the switch array as a non-selected cell, to which no data are written, in FIG. 3. A voltage of 19 V is applied to memory cell transistors FC21, FC22 of the cell 01 through the wiring WL210. However, since a voltage of 3 V is applied to each of the wirings BL211 and BL221 to which the memory cell transistors FC21, FC22 are connected, respectively, an electric field necessary for electrons to tunnel through a tunnel film of each of the memory cell transistors FC21, FC22 cannot be obtained. As a consequence, no data are written to any of the memory cell transistors FC21, FC22.

A substrate voltage applied from the wiring SUB211 to the memory cell transistors FC21, FC22 of the cell 01 may be any as long as not exceeding the voltage applied to the memory cell transistors FC21, FC22 from the wirings BL211, BL221 (3V). Nevertheless, a voltage of approximately 1.5 V to 3 V is desirable in order to reduce the electric fields of the tunnel films to prevent erroneous writing.

In this case, an effective voltage of 16 V is applied to the gates of the memory cell transistors FC21, FC22. Accordingly, the memory cell transistors FC21, FC22 are turned into an ON state, and a voltage of 3 V is applied to a connection node Q. To prevent a pass transistor PT1 from being damaged, a substrate voltage of 1.5 V is applied to the pass transistor PT1 from the wiring SUB221. With this application, the voltage applied to a gate insulating film of the pass transistor PT1 results in 1.5 V substantially, and hence the gate insulating film can be protected.

Figure 6:
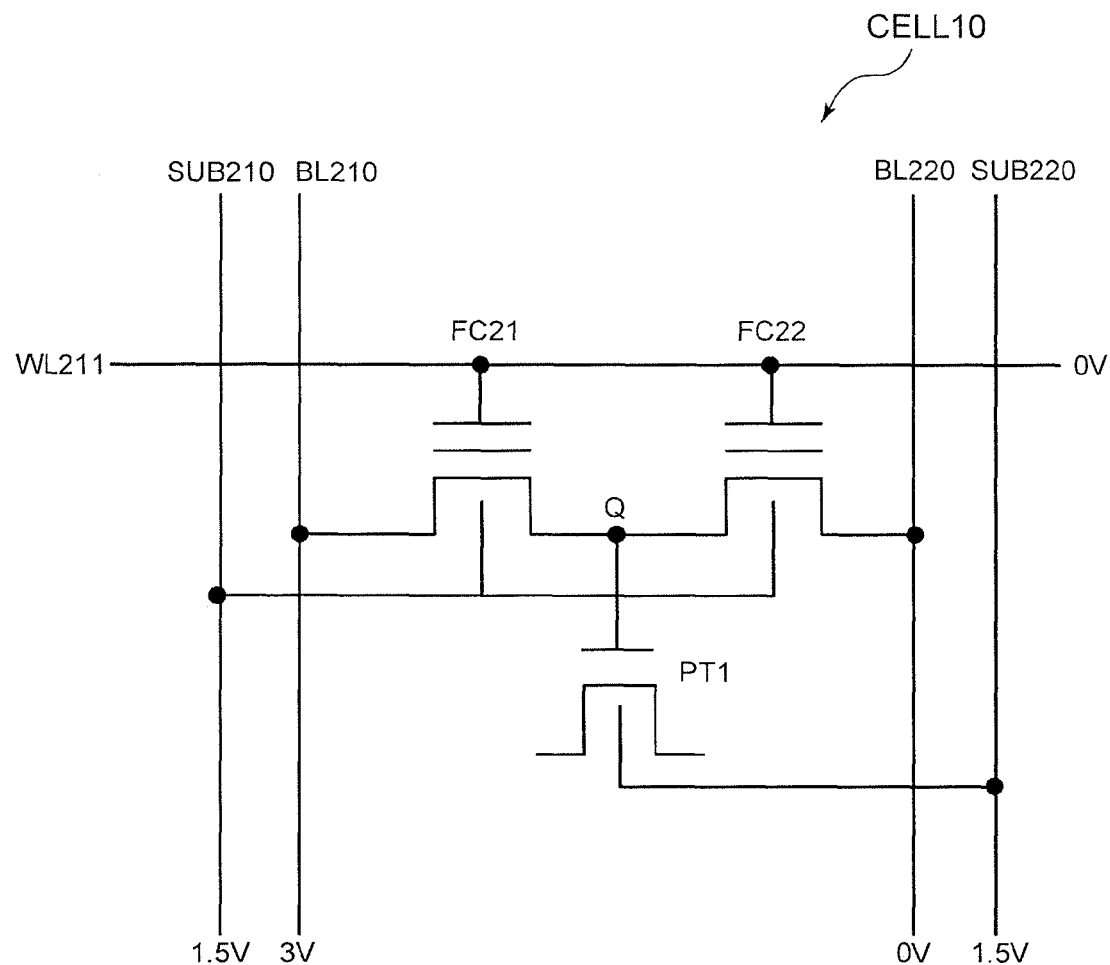
FIG. 6 is a circuit diagram showing a cell 10 in the switch array using the logic switches according to the first embodiment.

FIG. 6 shows the cell 10 of the switch array as a non-selected cell, to which no data are written, in FIG. 3. Since a voltage applied to the wiring WL211 connected to gates of memory cell transistors FC21, FC22 of the cell 10 is 0 V, no data are written to any of the memory cell transistors FC21, FC22. However, the memory cell transistor FC21 is turned into an ON state when a voltage of 0 V is applied to the gate, in some cases. In such a case, a voltage of 3 V is applied to a connection node Q. Accordingly, a substrate voltage of 1.5 V is applied to a pass transistor PT1 from the wiring SUB220. With this application, the voltage applied to a gate insulating film of the pass transistor PT1 results in 1.5 V substantially, and hence the gate insulating film can be protected.

Figure 7:
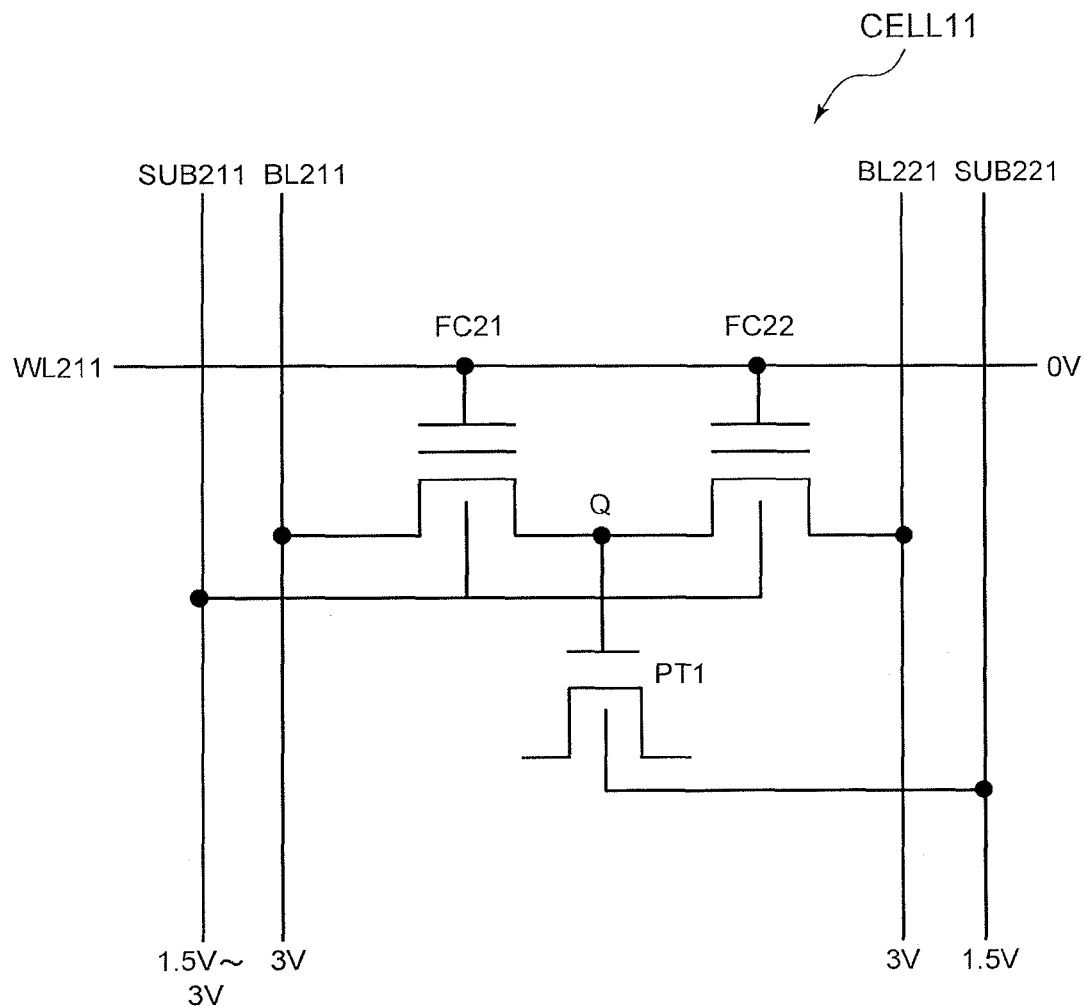
FIG. 7 is a circuit diagram showing a cell 11 in the switch array using the logic switches according to the first embodiment.

FIG. 7 shows the cell 11 of the switch array as a non-selected cell, to which data are not written, in FIG. 3. Since a voltage applied to the wiring WL211 connected to memory cell transistors FC21, FC22 of the cell 11 is 0 V, no data are written to any of the memory cell transistors FC21, FC22. However, any one of or both of the memory cell transistors FC21, FC22 is turned into an ON state when a voltage of 0 V is applied to the gates, in some cases. In such a case, a voltage of 3 V is applied to a connection node Q. Accordingly, a substrate voltage of 1.5 V is applied to a pass transistor PT1 from the wiring SUB221. With this application, the voltage applied to a gate insulating film of the pass transistor PT1 results in 1.5 V effectively, and hence the gate insulating film can be protected.

Next, a method of erasing data from a switch array will be described. To erase data from a switch array, erasing does not need to be performed for each memory cell transistor or for each logic switch. It is only necessary to erase the data all at once and then write necessary data again.

Figure 9:
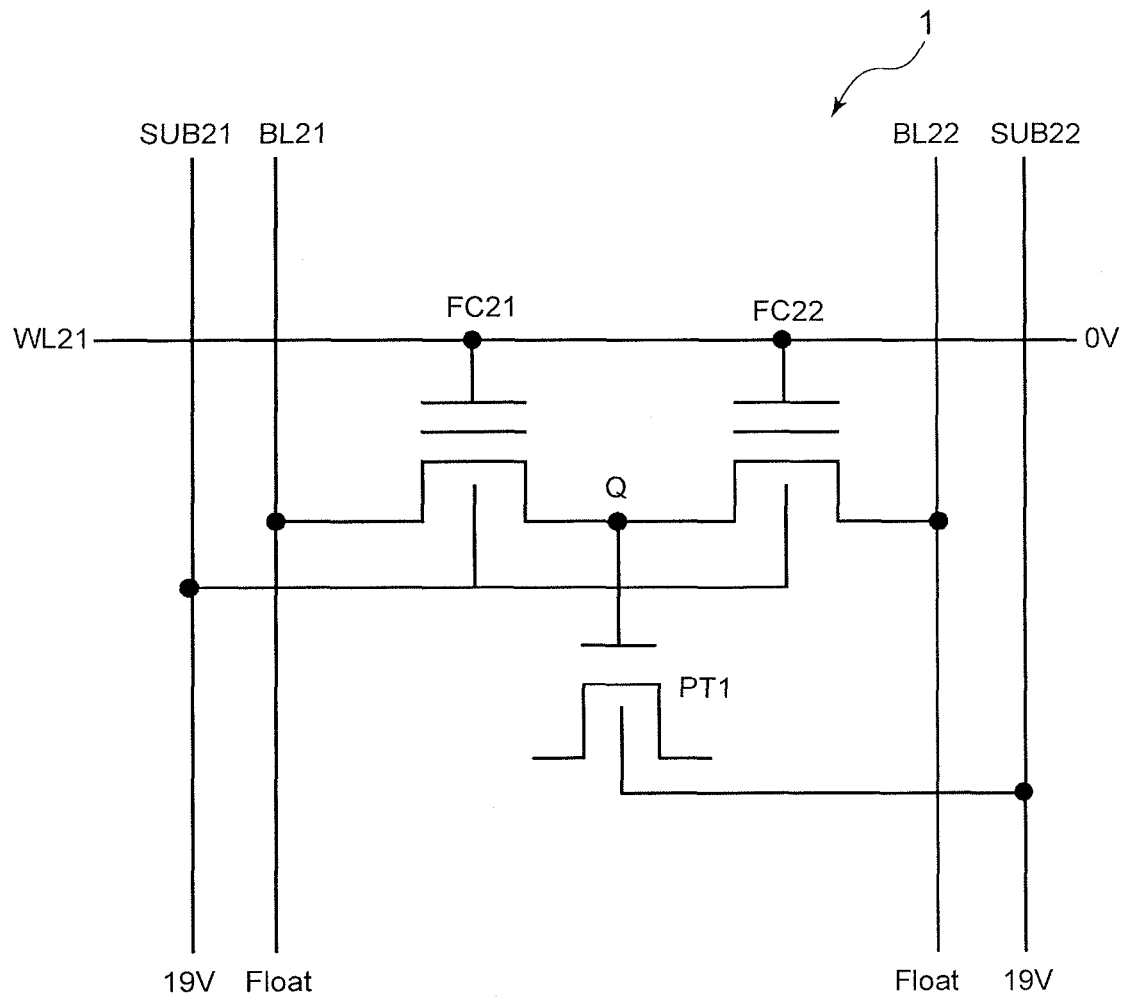
FIG. 9 is a circuit diagram showing voltages applied to wiring lines in erasing data stored in the switch array including the logic switches according to the first embodiment.

In erasing data from a switch array, voltages are applied to all logic switches included in the switch array through wiring lines, as shown in FIG. 9. Specifically, voltages to be applied to gates of memory cell transistors FC21, FC22 are set at 0 V by grounding the wiring WL to which the gates are connected and substrate voltages to be applied to the memory cell transistors FC21, FC22 and a pass transistor PT1 are set at a high voltage of 19 V, for example. All the other terminals are in a floating state. A high electric field is applied to a block film of each of the memory cell transistors FC21, FC22, electrons trapped in a charge-trapping site of a charge accumulation insulating film of each of the memory cell transistors FC21, FC22 are derived out from the electron-trapping site, and thereby data are erased.

When a high voltage of 19 V is applied to the wiring SUB21, a forward bias is applied to a PN-junction between a substrate and a source-drain electrode of each of the memory cell transistors FC21, FC22. For this reason, a large voltage of 19 V is applied to a connection node Q. However, by applying a substrate voltage of 19 V to the pass transistor PT1 from the wiring SUB22, a voltage applied to a gate insulating film of the pass transistor PT1 is cancelled out by the substrate voltage, and hence the gate insulating film is prevented from being destroyed.

As described above, according to the embodiment, data can be written to only one of the memory cell transistors included in a desired one of the logic switches in the switch array, by adjusting voltages applied to the wirings WL21, BL21, BL22, SUB21, SUB22. Moreover, it is also possible to erase data in a logic switch of the switch array all at once. Furthermore, in writing and erasing data, a substrate voltage applied to the gate insulating film of the pass transistor can be retained within a predetermined range by adjusting the substrate voltage applied to the pass transistor, thereby preventing the pass transistor from being damaged.

It should be noted that the voltages applied to the wirings in the above descriptions are only examples, and can be modified appropriately in accordance with the threshold voltages of memory cell transistors, the threshold voltage range of a pass transistor, and the like.

Next, a method of manufacturing a logic switch 1 according to the embodiment will be described with reference to FIG. 10 to FIG. 20.

Figure 10:
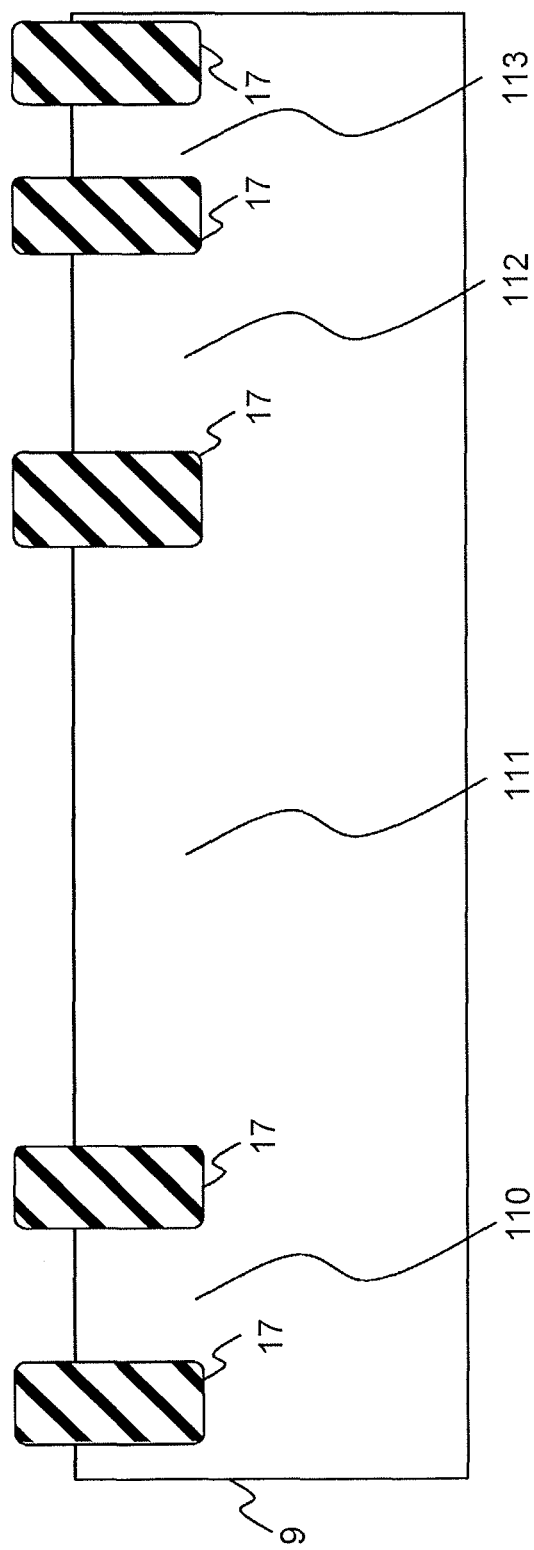
FIG. 10 is a cross-sectional diagram showing a method of manufacturing the logic switch according to the first embodiment.
Figure 11:
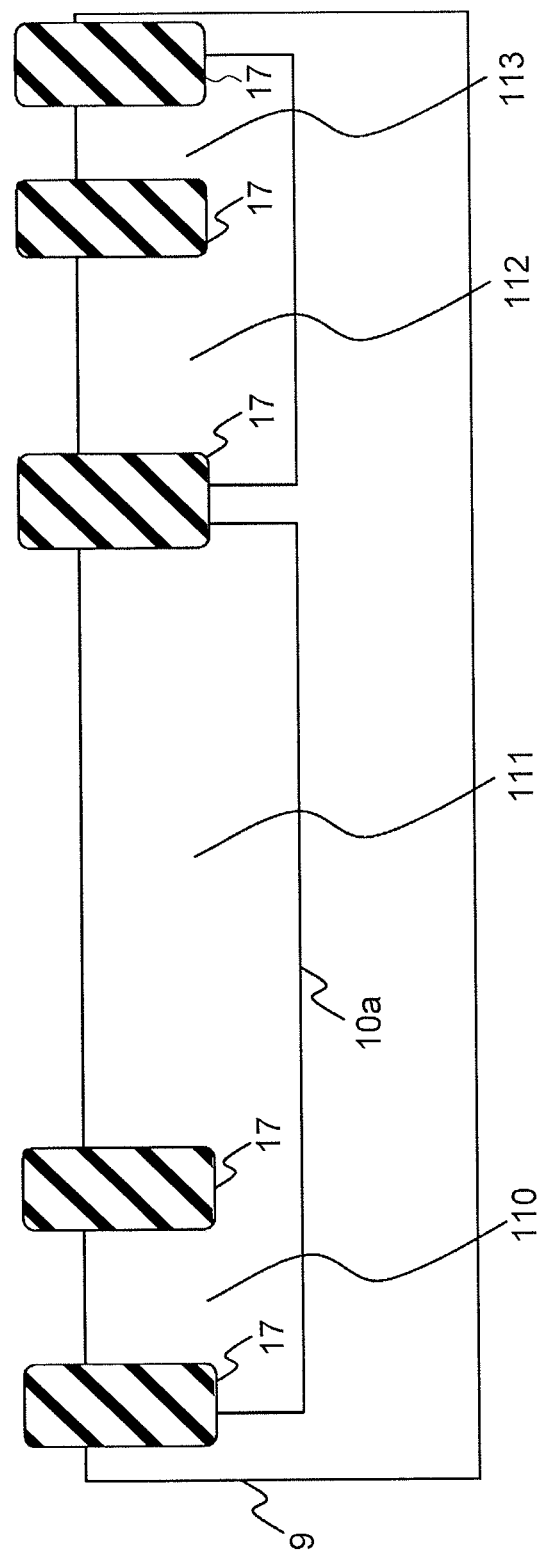
FIG. 11 is a cross-sectional diagram showing the method of manufacturing the logic switch according to the first embodiment.

As shown in FIG. 10, an element isolation layer 17 such as an STI (Shallow Trench Isolation) is formed in a silicon substrate 9, to thereby divide the silicon substrate 9 into four regions 110, 111, 112, 113. As shown in FIG. 11, acceptor ions such as boron are implanted into the entire regions 110, 111 and the entire regions 112, 113, to form p-type wells 10a, 10b. The p-type wells 10a, 10b are formed to have a larger depth than that of the element isolation layer 17. Thus, the regions 110, 111 are electrically connected to each other, and the regions 112, 113 are electrically connected to each other, in the silicon substrate 9.

Then, ions are implanted into the regions 111, 112 as needed, to form channels. In this implantation, the ions may be implanted into the regions 111, 112 separately by lithography using a mask, or may be implanted into the regions 111, 112 at the same time. Alternatively, ion injection needs not be performed. Subsequently, annealing is performed by means of a method such as RTA (Rapid Thermal Anneal), for example, and the acceptors in the wells 10a, 10b and channels are thereby activated. The annealing temperature is approximately 1000° C., for example, and the annealing time is approximately one second, for example.

Figure 12:
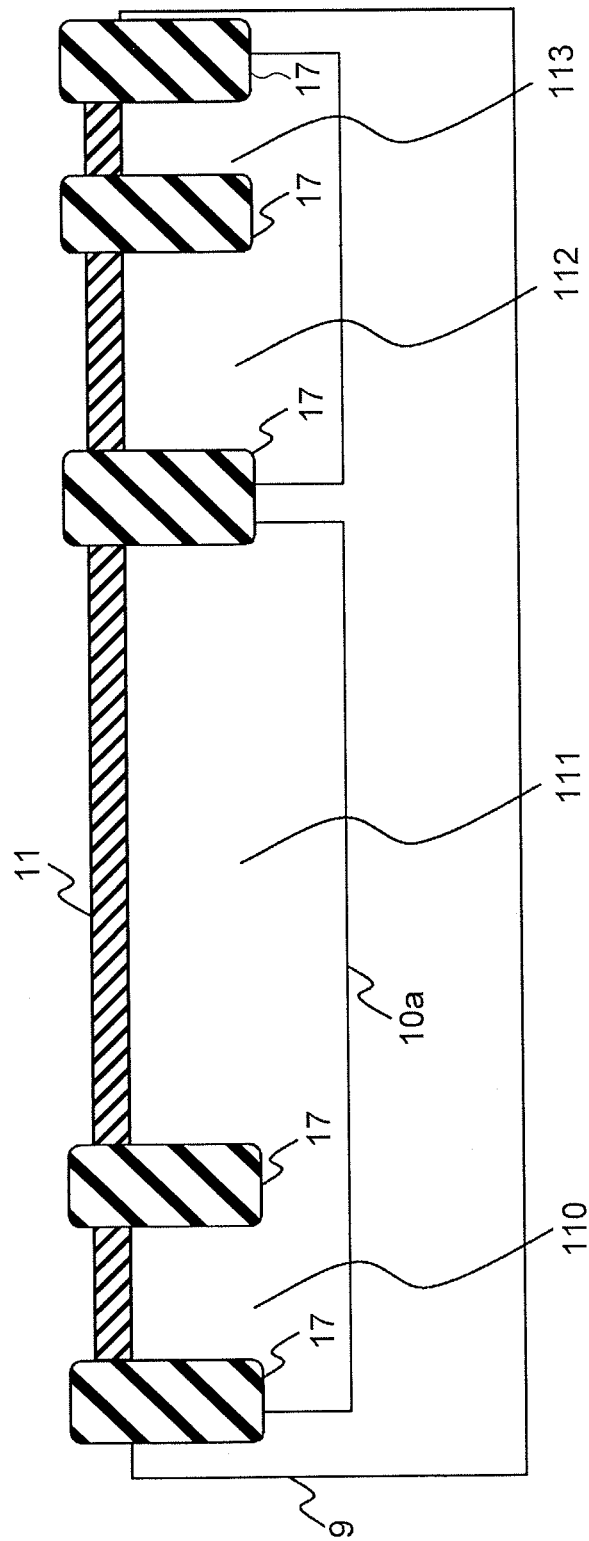
FIG. 12 is a cross-sectional diagram showing the method of manufacturing the logic switch according to the first embodiment.
Figure 13:
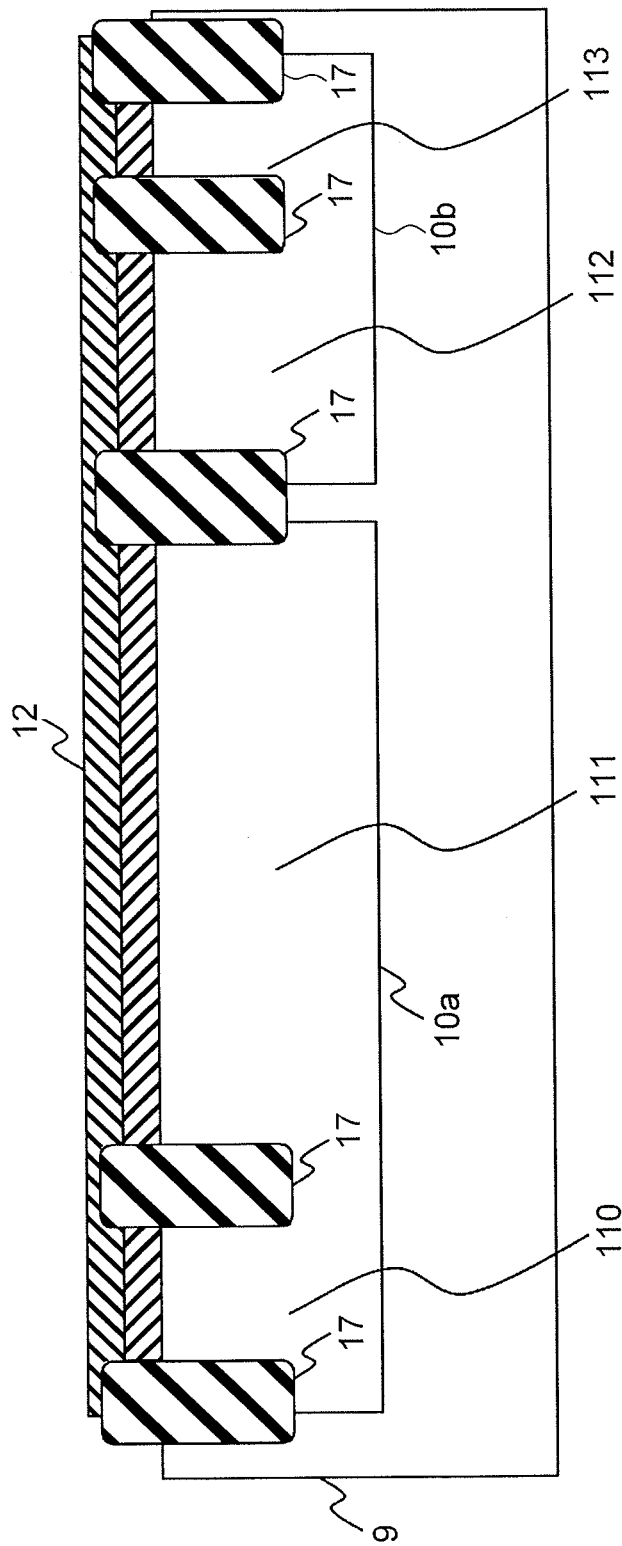
FIG. 13 is a cross-sectional diagram showing the method of manufacturing the logic switch according to the first embodiment.
Figure 14:
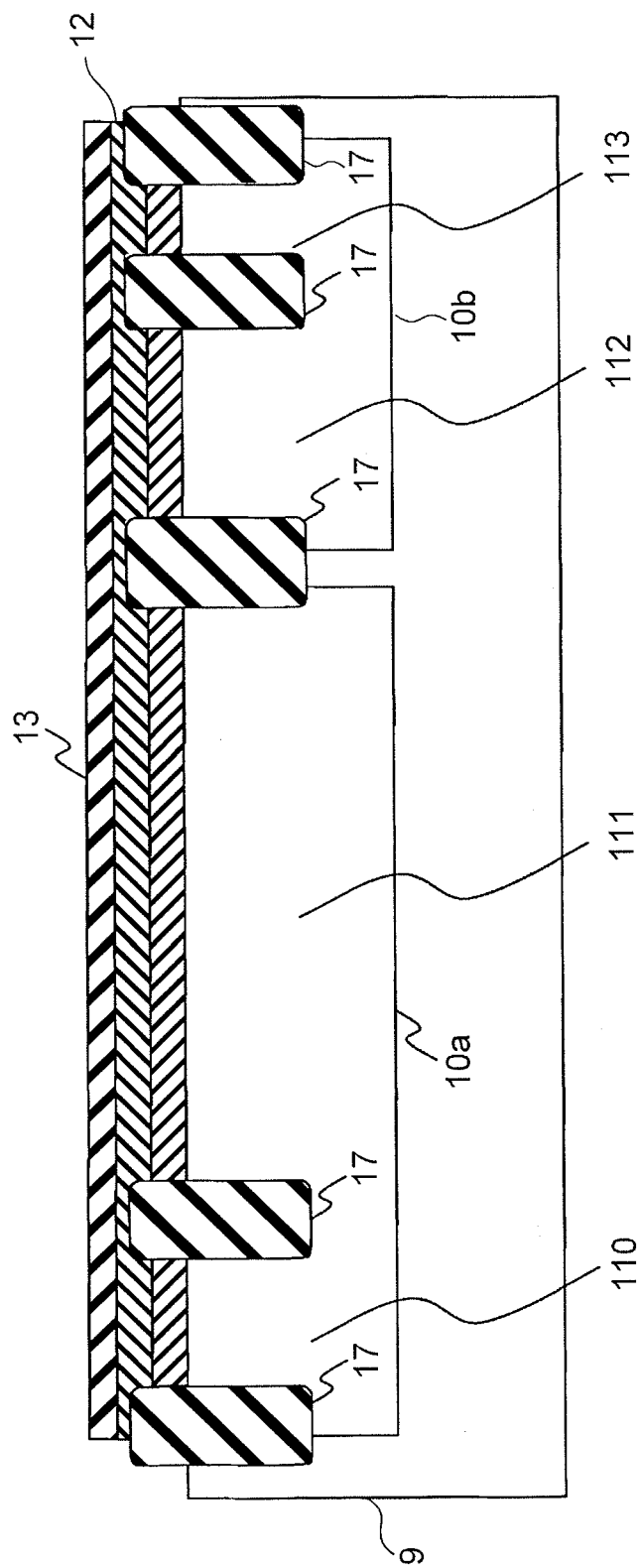
FIG. 14 is a cross-sectional diagram showing the method of manufacturing the logic switch according to the first embodiment.
Figure 15:
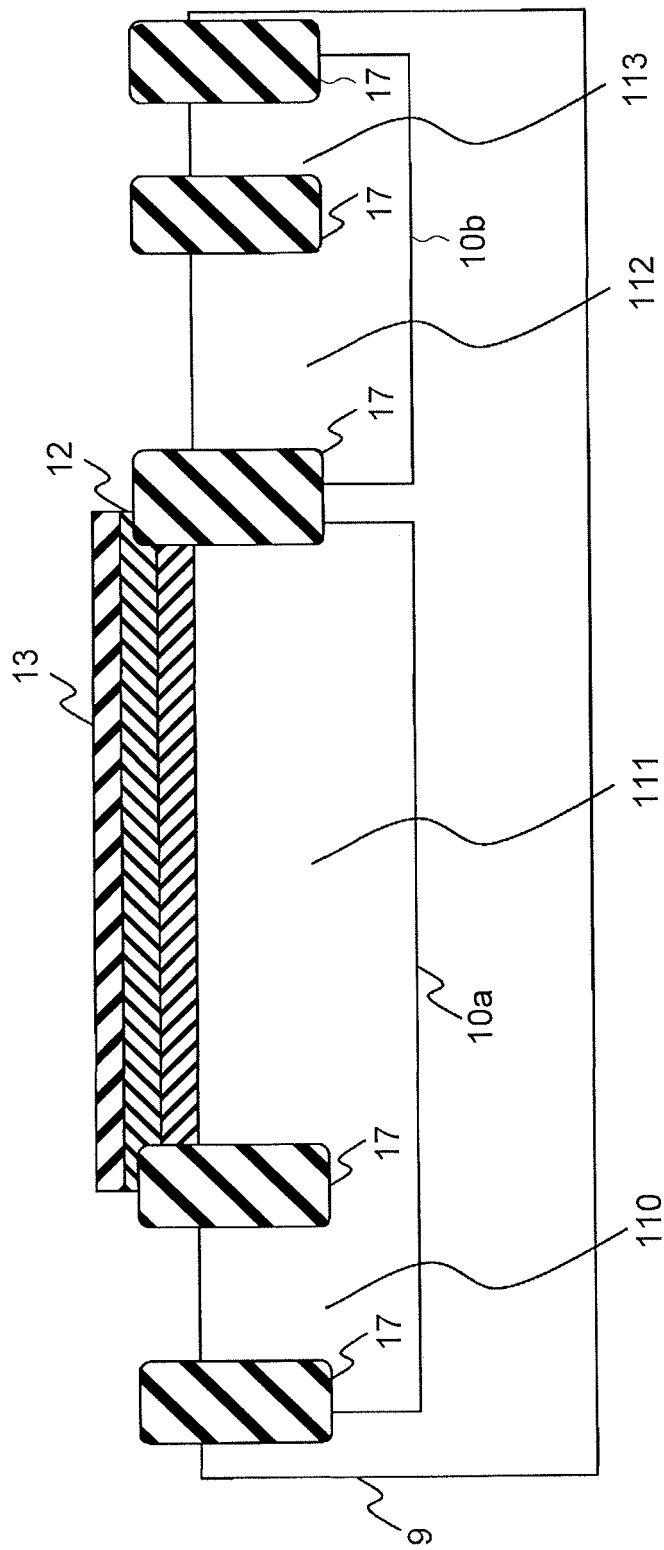
FIG. 15 is a cross-sectional diagram showing the method of manufacturing the logic switch according to the first embodiment.

Then, as shown in FIG. 12, an oxide film 11 to serve as tunnel films of MONOS transistors is formed on an entire upper surface of the substrate. As shown in FIG. 13, a nitride film 12 to serve as charge accumulation insulating films is formed on the oxide film 11. As shown in FIG. 14, an oxide film 13 to serve as block films is formed on the nitride film 12. As shown in FIG. 15, a mask is formed on the region 111 on which memory cell transistors FC21, FC22 are to be formed, by lithography or the like, and the oxide film 11, the nitride film 12 and the oxide film 13 on the regions 110, 112, 113 are removed by means of a method such as RIE, for example.

Figure 16:
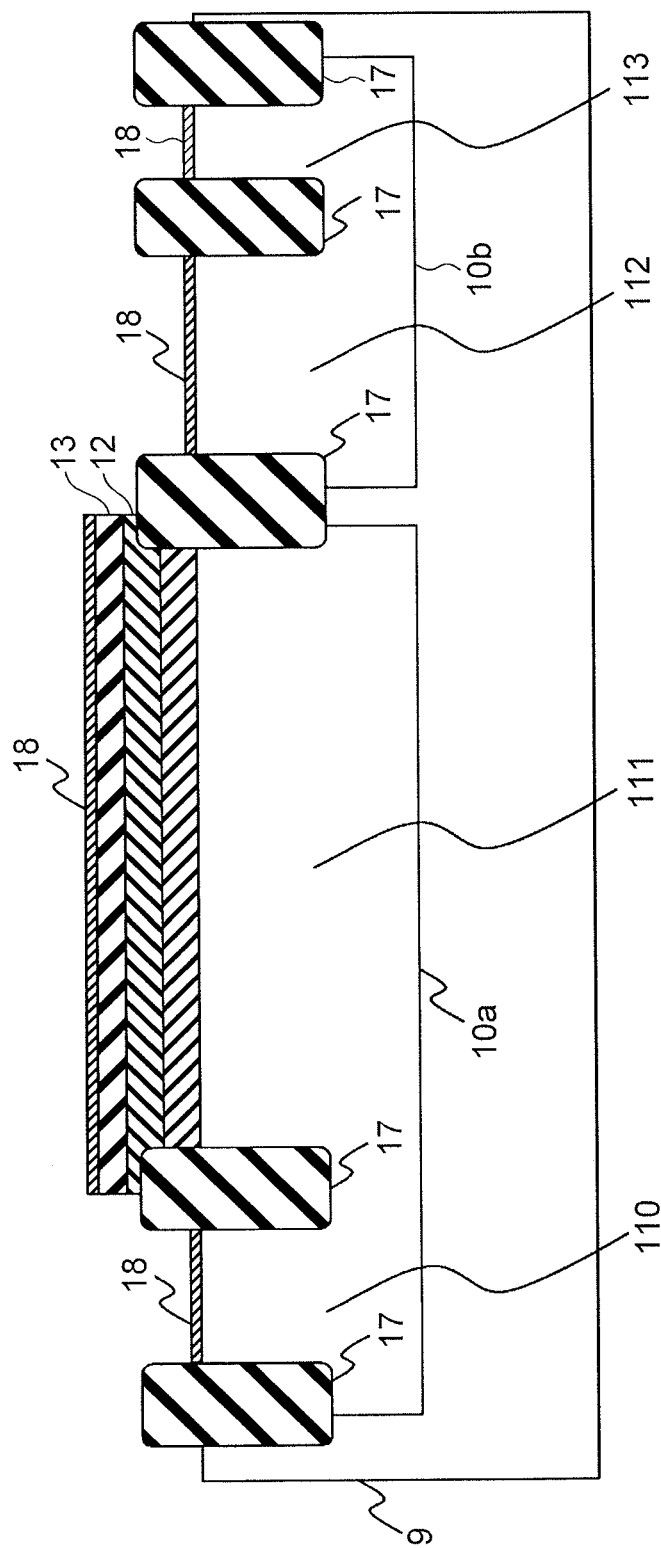
FIG. 16 is a cross-sectional diagram showing the method of manufacturing the logic switch according to the first embodiment.

As shown in FIG. 16, a gate insulating film 18 for a pass transistor is formed entirely. The gate insulating film 18 is an insulating film made of SiO2, an insulating film made of SiON, or a high-k insulating film such as an HfSiON insulating film, for example. FIG. 16 illustrates a state in which the gate insulating film 18 is formed on the oxide film 13 formed on the region 111. Meanwhile, FIG. 17 to FIG. 20 illustrate that both the oxide film 13 and the gate insulating film 18 are made of SiO2, and the oxide film 13 and the gate insulating film 18 on the region 111 are shown together as the oxide film 13.

Figure 17:
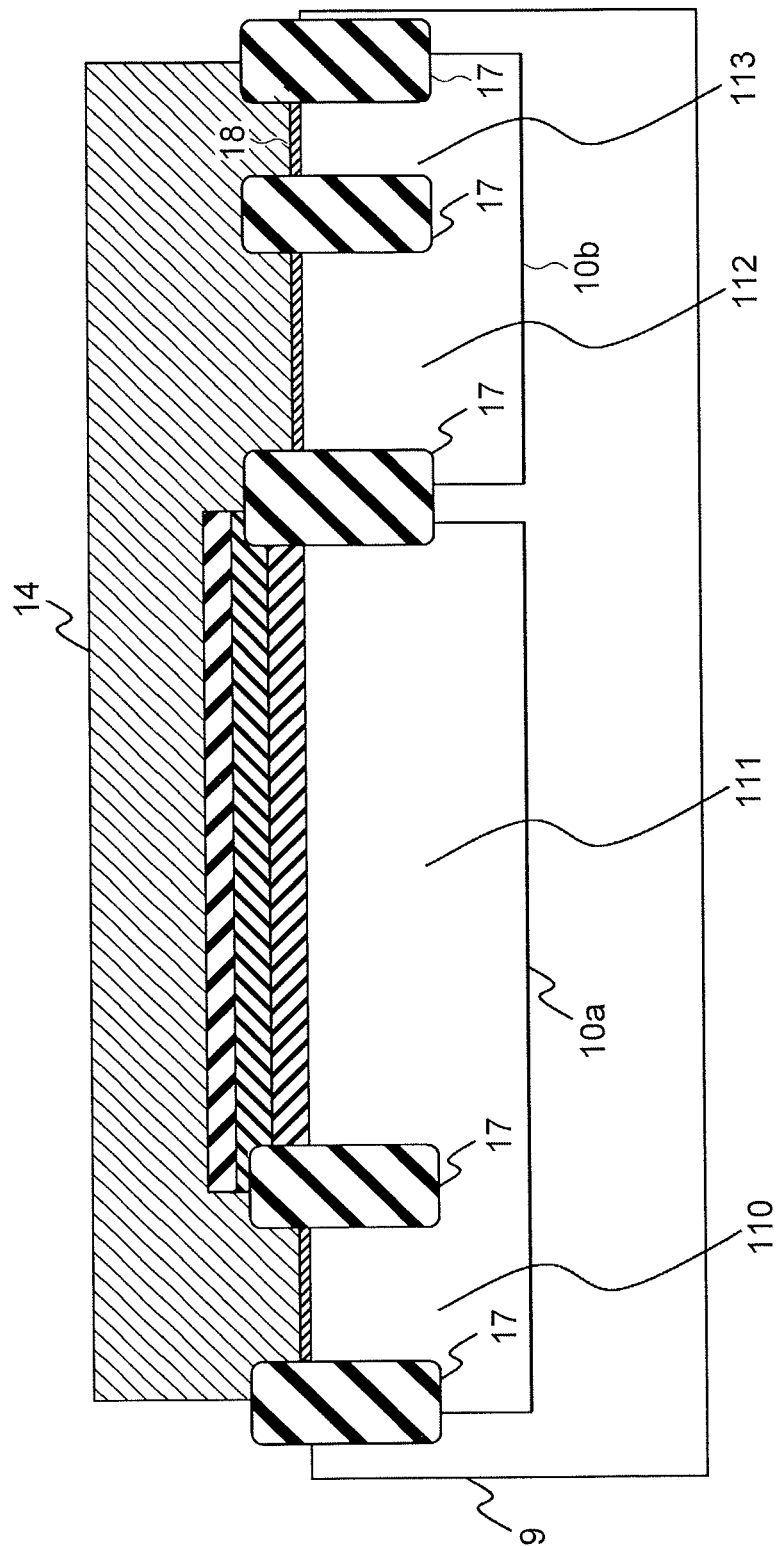
FIG. 17 is a cross-sectional diagram showing the method of manufacturing the logic switch according to the first embodiment.
Figure 18:
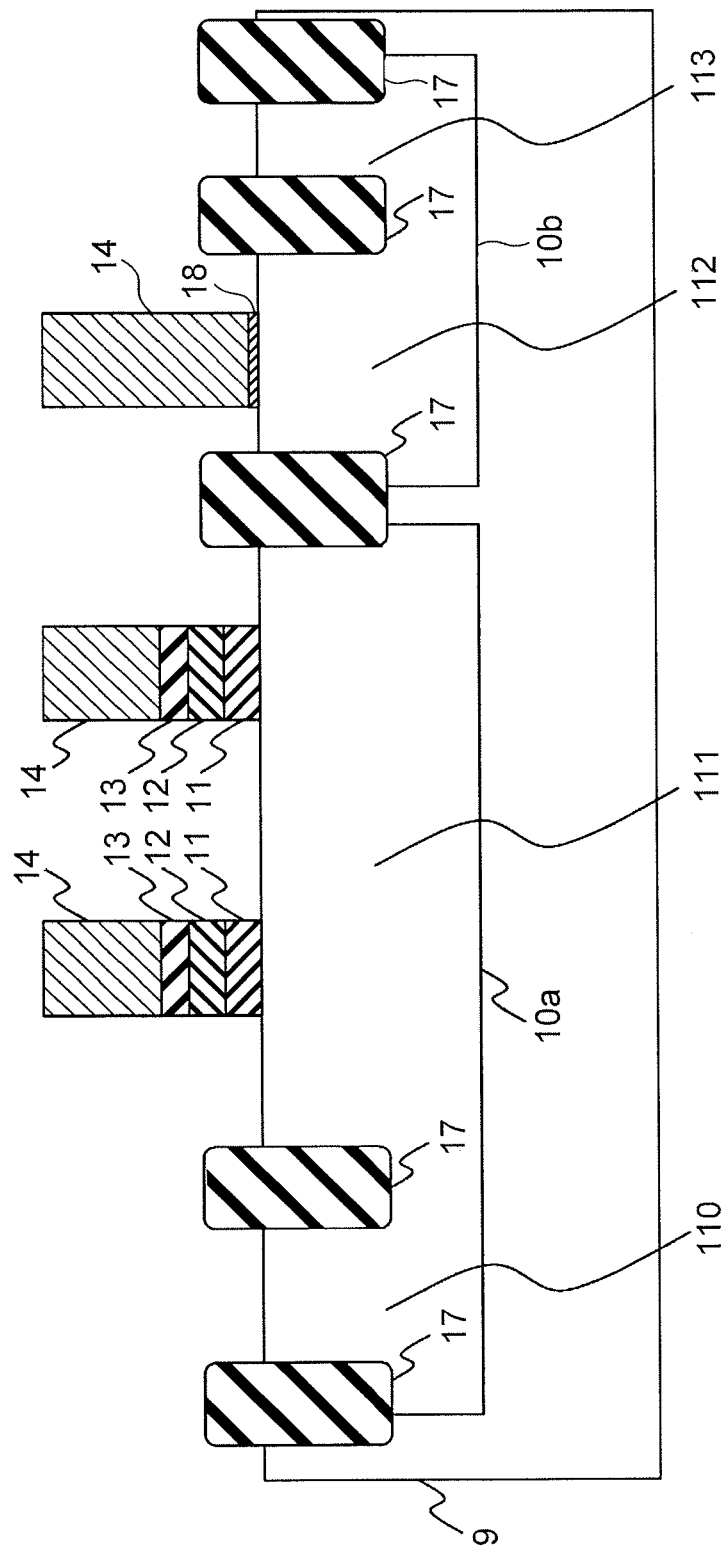
FIG. 18 is a cross-sectional diagram showing the method of manufacturing the logic switch according to the first embodiment.
Figure 19:
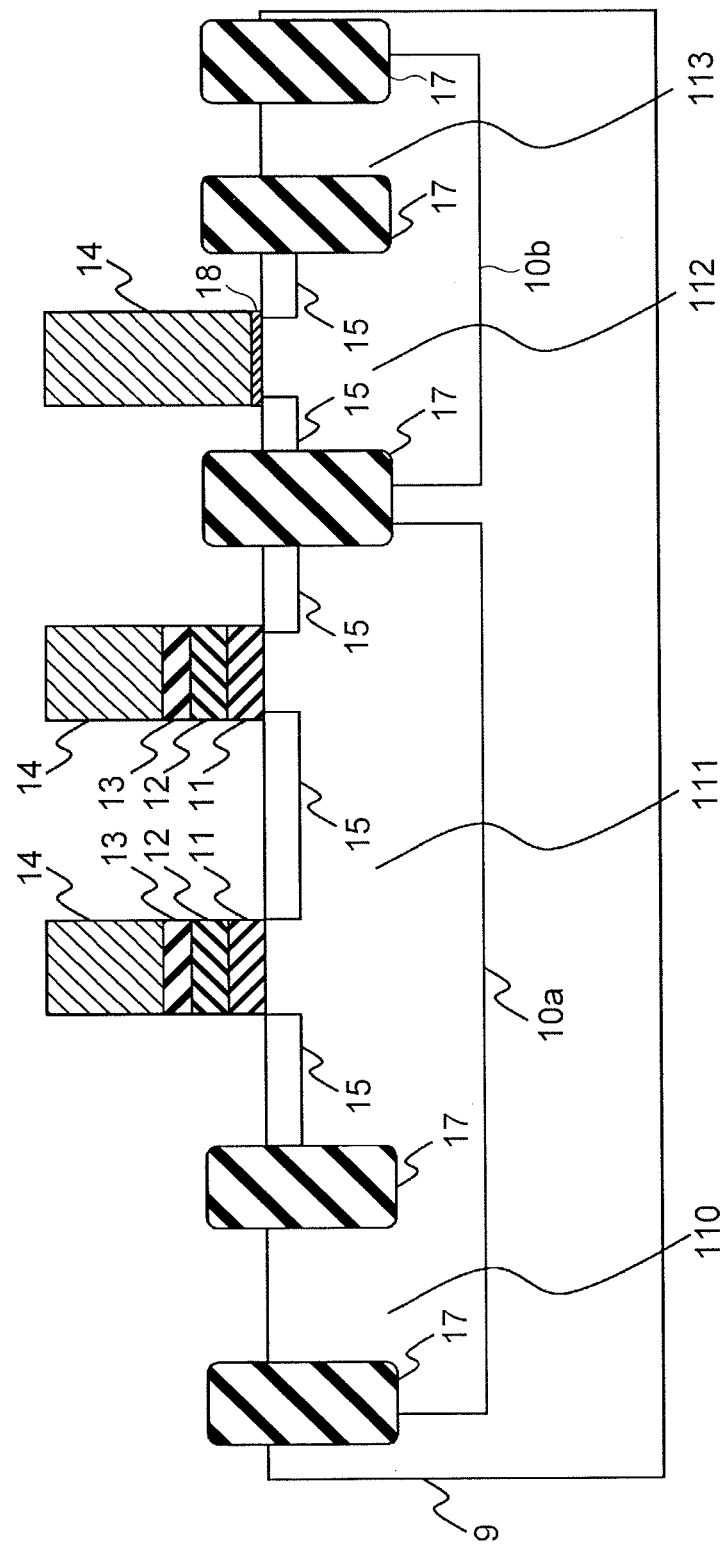
FIG. 19 is a cross-sectional diagram showing the method of manufacturing the logic switch according to the first embodiment.
Figure 20:
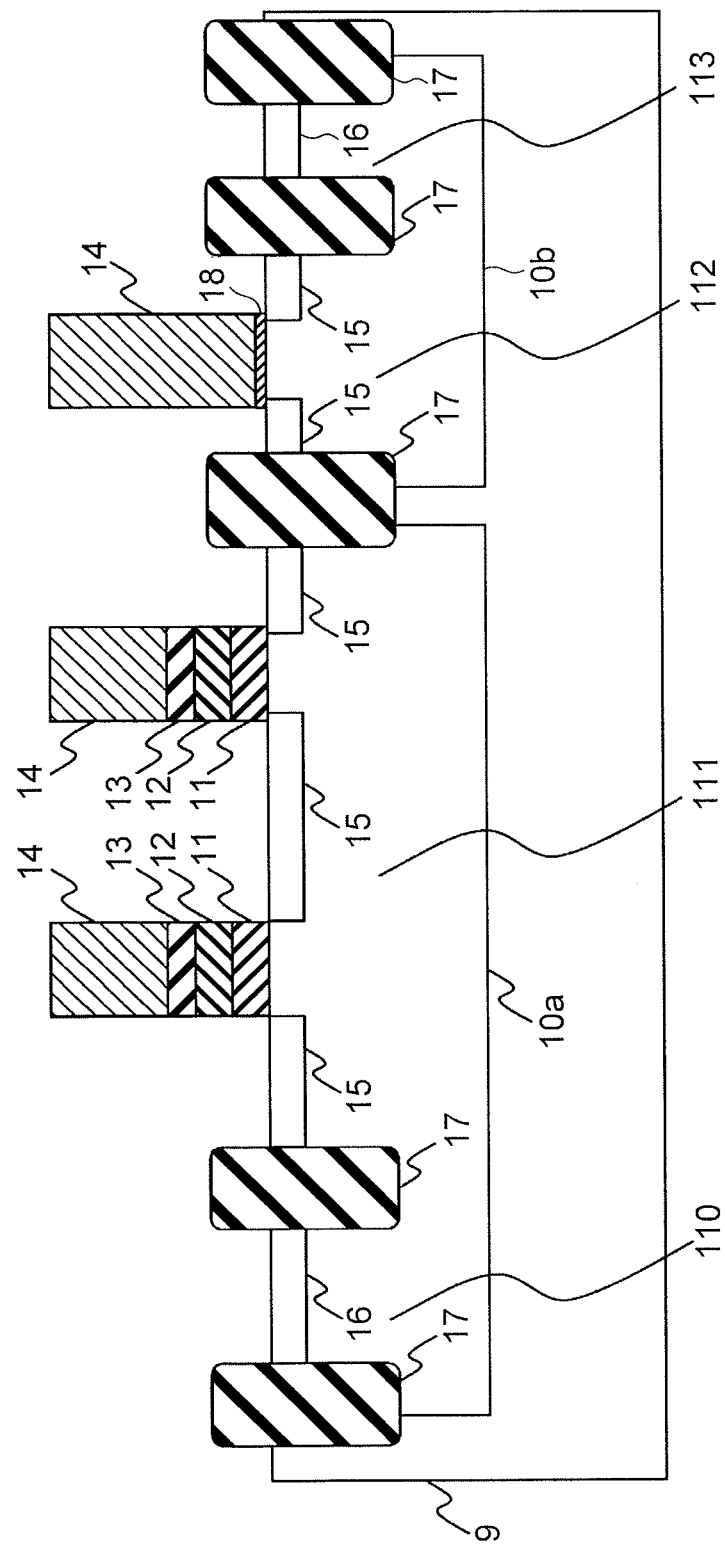
FIG. 20 is a cross-sectional diagram showing the method of manufacturing the logic switch according to the first embodiment.

As shown in FIG. 17, a film made of metal, amorphous silicon or poly-crystalline silicon to serve as gate electrodes of the memory cell transistors FC21, FC22 and the pass transistor PT1 is formed on the gate insulating film 18. Then, as shown in FIG. 18, gate electrodes are patterned by lithography, and gate electrodes 14 are formed by means of a method such as RIE, for example. As shown in FIG. 19, donor ions are implanted to form source drain electrodes of the memory cell transistors FC21, FC22 and the pass transistor PT1, by using the gate electrodes 14 as masks. In this process, masks may be formed on the regions 110, 113, on which none of the memory cell transistors FC21, FC22 and the pass transistor PT1 are to be formed, by lithography or the like, to prevent the donor ions from being implanted. As shown in FIG. 20, acceptor ions may be implanted into the regions 110, 113 to form substrate electrodes, by using masks formed on the regions 111, 112 as needed by lithography or the like. After a process such as a salicide technique is performed as needed, wiring is provided, thus forming the logic switch 1 shown in FIG. 1.

Second Embodiment

Figure 21:
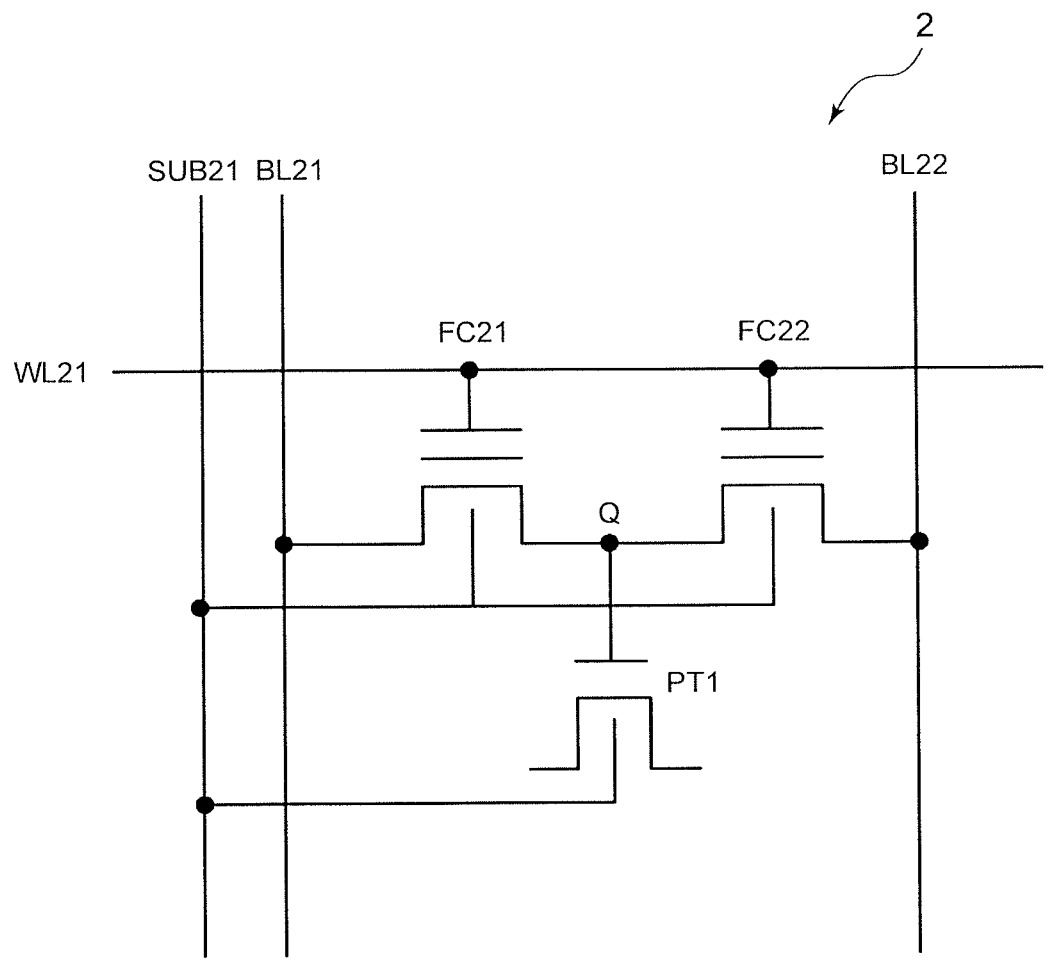
FIG. 21 is a circuit diagram showing a logic switch according to a second embodiment.
Figure 22:
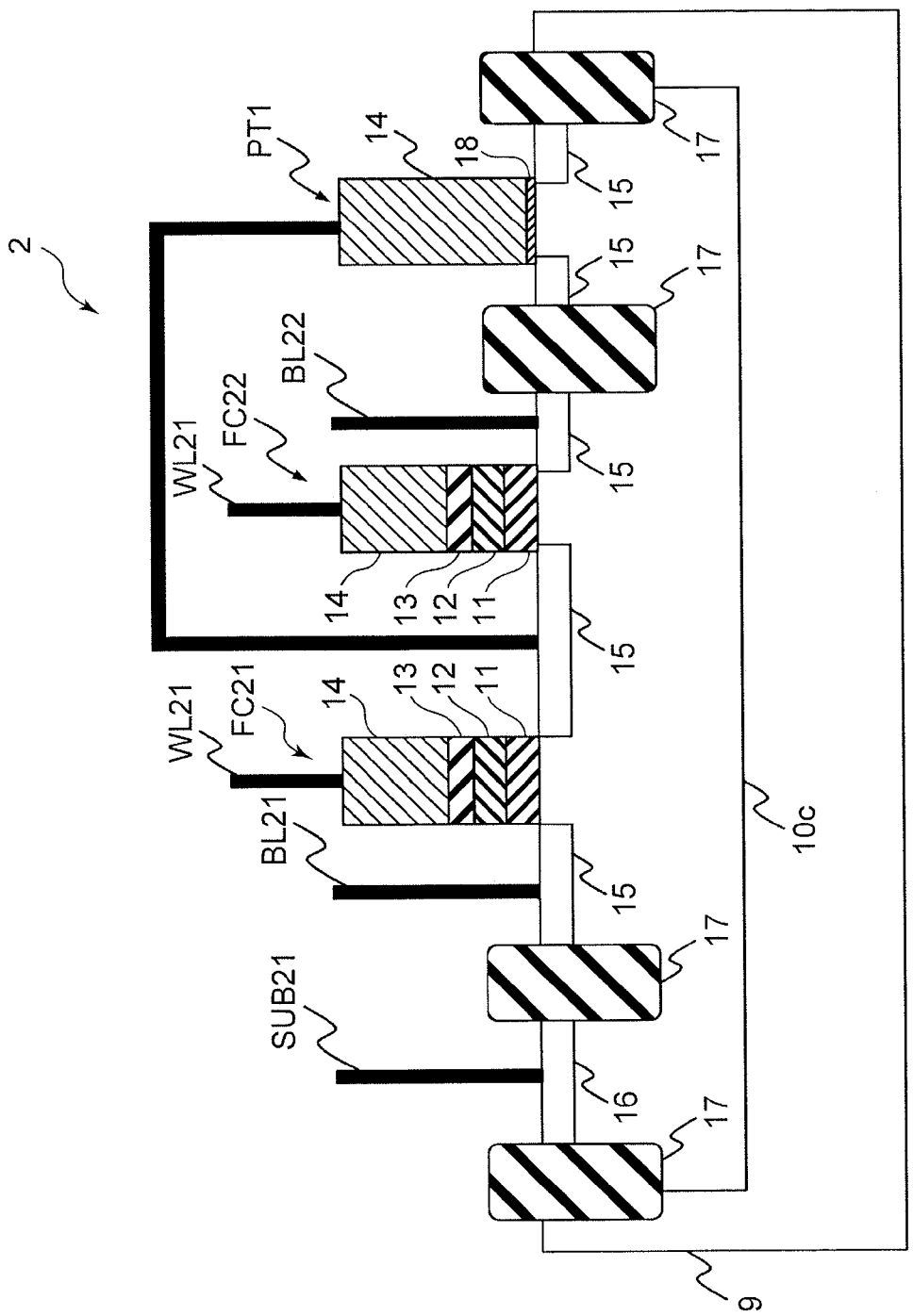
FIG. 22 is a cross-sectional view showing the logic switch according to the second embodiment.

Next, descriptions will be given of a logic switch according to a second embodiment. FIG. 21 is a circuit diagram of a logic switch 2 according to the second embodiment, and FIG. 22 is a cross-sectional diagram of the logic switch 2. In FIG. 21 and FIG. 22, the same portions as those of the logic switch 1 according to the first embodiment are denoted by the same reference numerals, and detailed descriptions of the portions are omitted.

As shown in FIG. 21 and FIG. 22, memory cell transistors FC21, FC22 of the logic switch 2 are formed on a single well 10c. A substrate electrode provided to the well 10c is only a substrate electrode 16 connected to a wiring SUB21. For this reason, the area of the logic switch 2 can be reduced compared with the case in which two wells 10a, 10b are formed and two substrate electrodes 16 connected to the wirings SUB21, SUB22 are formed as in the logic switch 1 according to the embodiment 1.

Figure 23:
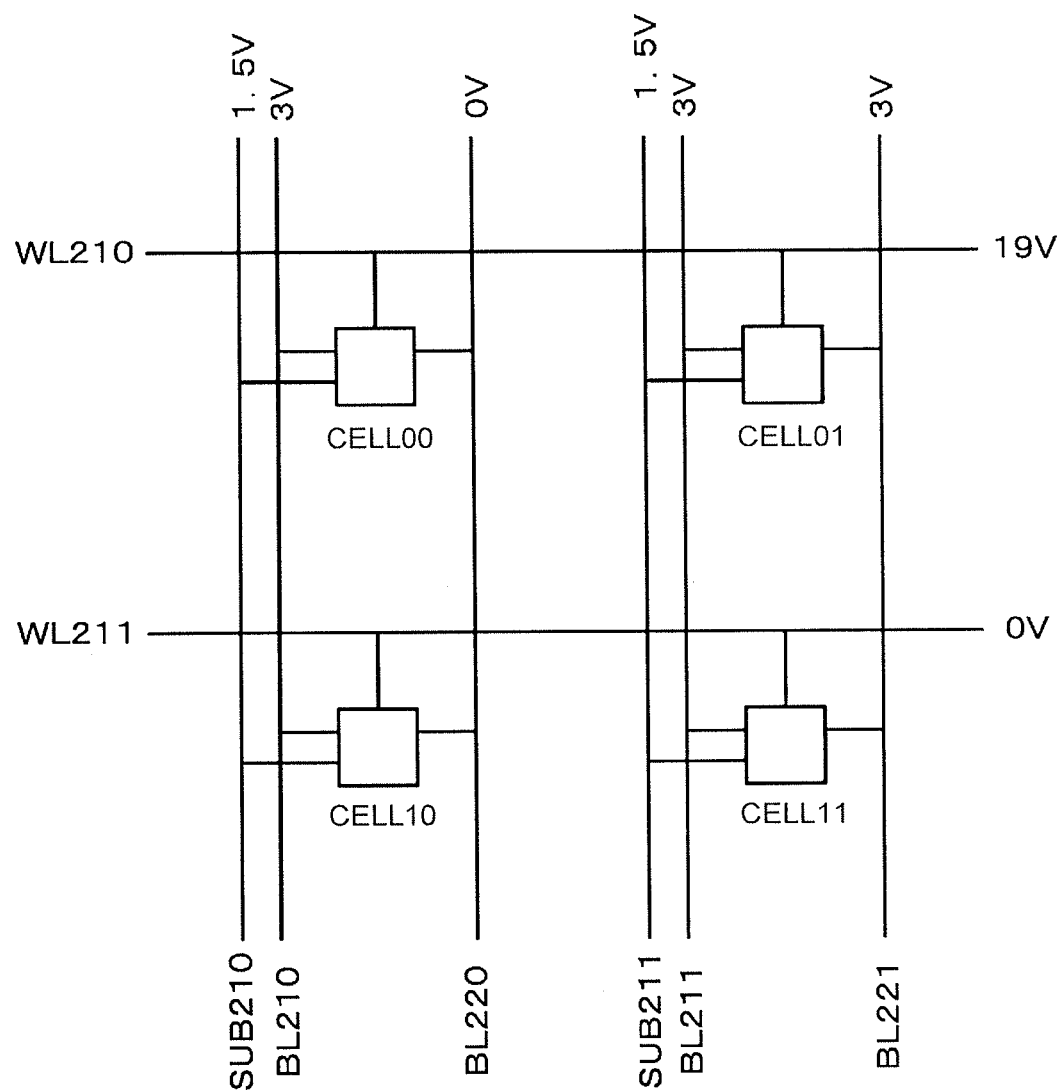
FIG. 23 is a circuit diagram showing a switch array using the logic switches according to the second embodiment.

FIG. 23 shows a switch array in which logic switches shown in FIG. 21 are arranged in an array. Each of cells 00, 01, 10, 11 in FIG. 23 corresponds to the logic switch shown in FIG. 21. To write data to the cell 00 of the switch array thus configured, voltages shown in FIG. 23, for example, are applied to the wirings of the switch array, respectively. The logic switch 2 according to the embodiment is different from the logic switch 1 described in the first embodiment in that wirings SUB210, SUB211 are connected to a pass transistor PT1 and a voltage of 1.5 V is applied to the SUB211. Nevertheless, the embodiment can also protect a gate insulating film of the pass transistor PT1 as the first embodiment.

A voltage high enough to turn the memory cell transistors FC21, FC22 into an ON state (19 V) is applied to a wiring WL210 of the cell 00 of the logic switch 2. Accordingly, electrical current flows from a wiring line BL210 to a wiring BL220. However, as described in the first embodiment, one of the memory cell transistors FC21, FC22 is turned into an ON state while the other is turned into an OFF state, in some cases. In such a case, a voltage of 0 V at minimum to 3 V at maximum is applied to a connection node Q, and the pass transistor PT1 may be destroyed. To prevent this phenomenon, a voltage which is between the maximum voltage and the minimum voltage to be applied to the connection node Q (1.5 V) is applied as a substrate voltage to the pass transistor PT1 through the wiring SUB210. With this application, a voltage applied to the gate insulating film of the pass transistor PT1 results in 1.5 V at maximum, substantially. Since 1.5 V is below the breakdown voltage of a logic transistor, the gate insulating film of the pass transistor PT1 is not damaged.

Memory cell transistors FC21, FC22 of the cell 01 of the logic switch 2 are turned into an ON state, and a voltage of 3 V is applied to a connection node Q. Since a substrate voltage of 1.5 V is applied to a pass transistor PT1 from the wiring SUB211, however, the pass transistor PT1 can be prevented from being damaged. Moreover, since a substrate voltage of 1.5 V is also applied to the memory cell transistors FC21, FC22 from the wiring SUB211, erroneous writing to the memory cell transistors FC21, FC22 can be prevented.

In each of the cells 10, 11 of the logic switch 2, a pass transistor PT1 can be prevented from being damaged by applying a substrate voltage to the pass transistor PT1. The reason is the same as that given to the cells 10, 11 described in the first embodiment, and hence descriptions of the reason are omitted here.

Figure 24:
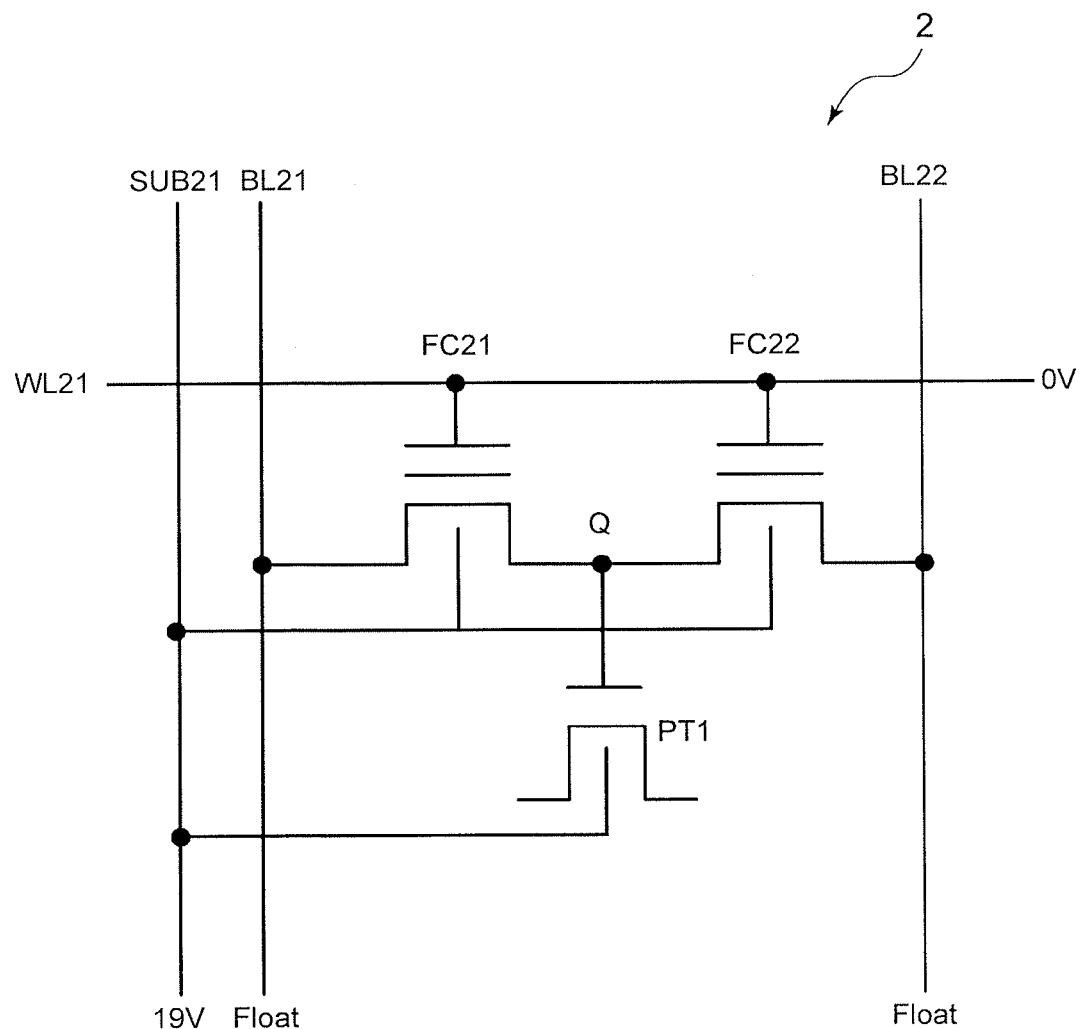
FIG. 24 is a circuit diagram showing voltages applied to wiring lines in deleting data stored in the switch array using the logic switches according to the second embodiment.

To erase data from the logic switch 2 according to the embodiment, voltages are applied to the logic switch through the wirings as shown in FIG. 24. Specifically, voltages to be applied to gates of the memory cell transistors FC21, FC22 are set at 0 V by grounding the wiring WL to which the gates are connected, and substrate voltages to be applied to the memory cell transistors FC21, FC22 and the pass transistor PT1 from the SUB21 are set at a high voltage of 19 V, for example. All the other terminals are in a floating state. A high electric field is applied to a block film of each of the memory cell transistors FC21, FC22, electrons trapped in a charge-trapping site of a charge accumulation insulating film of each of the memory cell transistors FC21, FC22 are derived out from the electron-trapping site, and thereby data are deleted.

When a high voltage of 19 V is applied to the wiring SUB21, a forward bias is applied to a PN junction between a substrate and a source drain electrode of each of the memory cell transistors FC21, FC22. For this reason, a large voltage of 19 V is applied to the connection node Q. However, since a substrate voltage of 19 V is also applied to the pass transistor PT1 from the wiring SUB21, a voltage applied to a gate insulating film of the pass transistor PT1 is cancelled out by the substrate voltage, and hence the gate insulating film is prevented from being destroyed.

Third Embodiment

Figure 25:
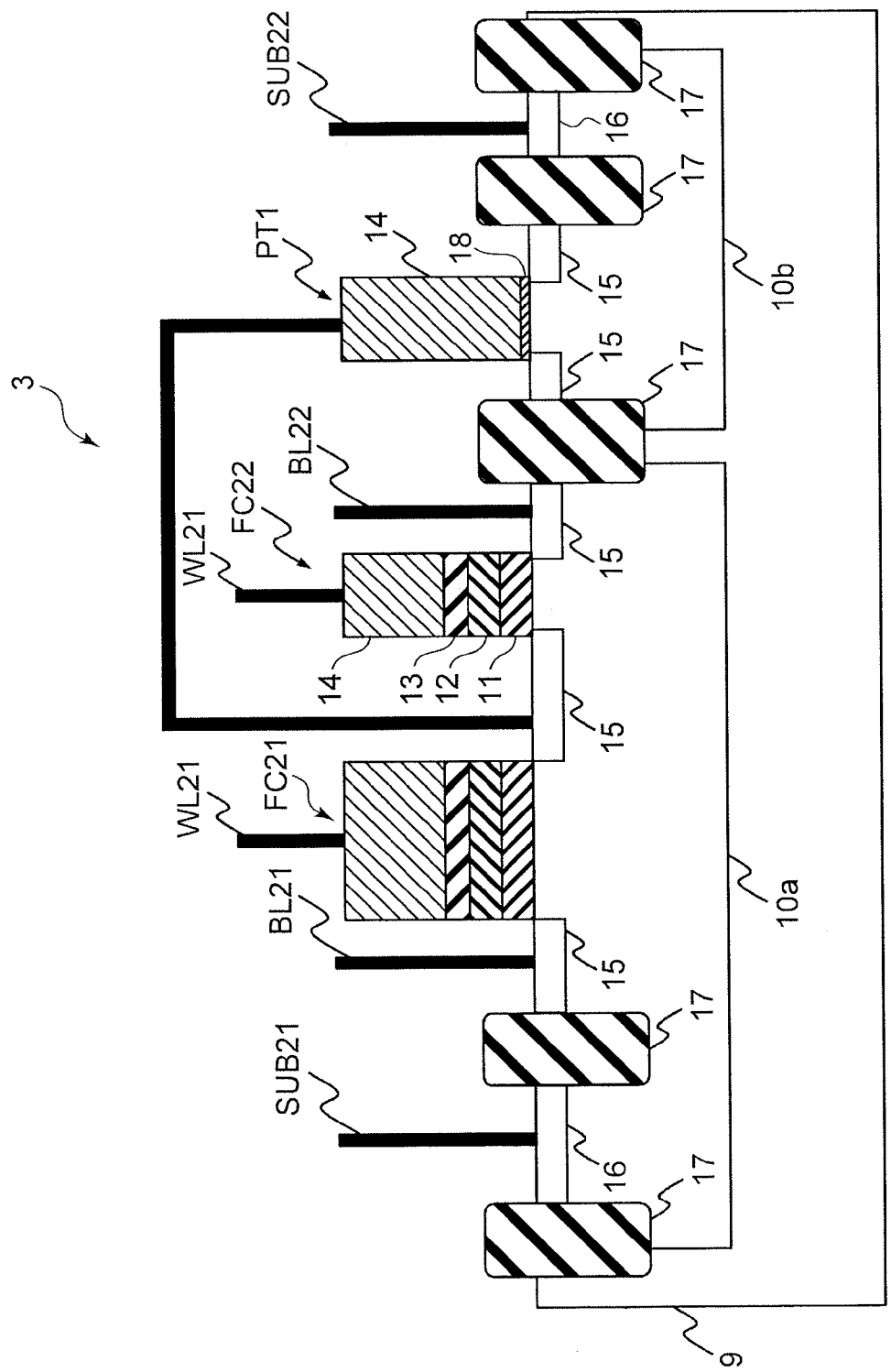
FIG. 25 is a cross-sectional diagram showing a logic switch according to a third embodiment.

Next, descriptions will be given of a logic switch according to a third embodiment. FIG. 25 is a cross-sectional diagram of the logic switch according to the third embodiment. In FIG. 25, the same portions as those of the logic switch 1 according to the first embodiment are denoted by the same reference numerals, and detailed descriptions of the portions are omitted. Memory cell transistors FC21, FC22 of a logic switch 3 according to the embodiment are different in gate length. By the difference in gate length between the memory cell transistors FC21, FC22, electric characteristics greatly change in a sub-threshold region especially in a channel region having a short-channel effect.

Assume that the gate length of the memory cell transistor FC21 is larger than that of the memory cell transistor FC22, and that a sub-threshold slope (S value) of the memory cell transistor FC21 is smaller than that of the memory cell transistor FC22, for example. In this case, when data are written to the memory cell transistor FC21 and the threshold value of the memory cell transistor FC21 increases, the sub-threshold current of the memory cell transistor FC21 dominates the current flowing between the wirings BL21 and BL22 in a region receiving a low voltage from the wiring WL21, and the S value of the current between the wirings BL21 and BL22 in relation to the voltage of the wiring WL21 results in being small. On the other hand, in a case that data are written to the memory cell transistor FC22 to increase the threshold voltage of the memory cell transistor FC22, S value of the current between the wirings BL21 and BL22 in relation to the voltage of the wiring WL21 results in being large.

In the case where the memory cell transistors FC21, FC22 are different in gate length as described above, it is possible to monitor which of the memory cell transistors FC21, FC22 is subjected to writing, on the basis of the S value of the current between the wirings BL21 and BL22 in relation to the voltage of the wiring WL21. In this way, verification can be performed. Since variations in gate processing by lithography is within 10%, verification can be performed accurately if the gate lengths are different at 20% or more.

Incidentally, although the case in which the gate length of the memory cell transistor FC21 is larger than that of the memory cell transistor FC22 has been described as an example in FIG. 25, the embodiment is also applicable to the case in which the gate length of the memory cell transistor FC22 is larger than that of the memory cell transistor FC21.

By employing the configuration of the above-described third embodiment, erroneous operation due to damage to the pass transistor can be prevented with an application of a substrate voltage to the pass transistor. Moreover, since an application of a negative voltage in writing or erasing data to or from the memory cell transistor is not needed, no negative voltage supply is required. Hence, the embodiment is applicable also to a floating gate transistor, a MONOS transistor or a SONOS transistor, which can provide a nonvolatile programmable logic switch being small in chip size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile programmable logic switch, comprising:
a first memory cell transistor including a first charge accumulation film, a first control gate connected to a first wiring and both first and second source-drains, where a first end of the first source-drain being connected to a second wiring;
a second memory cell transistor including a second charge accumulation film, a second control gate connected to the first wiring and both third and fourth source-drains, where a third end of the third source-drain being connected to a second end of the second source-drain of the first memory cell transistor, a fourth end of the fourth source-drain being connected to a third wiring;
a pass transistor including a gate electrode connected to the second end of the second source-drain of the first memory cell and the third end of the third source-drain of the second memory cell; and
a first substrate electrode applying a first substrate voltage to a first well of the pass transistor; wherein
a writing voltage is applied to the first wiring, a first voltage is applied to one of the second wiring and the third wiring and a second voltage which is lower than the first voltage is applied to the other of the second wiring and the third wiring, and the first substrate voltage which is higher than the second voltage and lower than the first voltage is applied to the first well of the pass transistor, when data is written into the first memory cell transistor or the second memory cell transistor.

2. The nonvolatile programmable logic switch of claim 1, wherein
the first memory cell transistor, the second memory cell transistor and the pass transistor are provided on the first well, and the first substrate electrode applies also the first substrate voltage to the first well of the first memory cell transistor and the second memory cell transistor.

3. The nonvolatile programmable logic switch of claim 1, further comprising;
a second well provided on a substrate, the second well being different from the first well provided on the substrate, the first memory cell transistor and the second memory cell transistor being provided on the second well; and
a second substrate electrode applying a second substrate voltage to the second well of the first memory cell transistor and the second memory cell transistor.

4. A nonvolatile programmable logic switch, comprising:
an isolation region provided on a semiconductor substrate;
a first semiconductor region with a first conductive type and a second semiconductor region with a second conductive type provided on the semiconductor substrate, the first semiconductor region and the second semiconductor region being separated each other by the isolation region;
a first diffusion region, a second diffusion region and a third diffusion region provided separately from each other on the first semiconductor region, the first diffusion region, the second diffusion region and the third diffusion region having the second conductive type;
a first memory cell transistor comprising,
a first insulator provided on a first portion of the first semiconductor region between the first diffusion region and the second diffusion region,
a first charge accumulation film accumulating electric charges provided on the first insulator,
a second insulator provided on the first charge accumulation film, and
a first control gate provided on the second insulator;
a second memory cell transistor comprising, a third insulator provided on a second portion of the first semiconductor region between the second diffusion region and the third diffusion region, a second charge accumulation film accumulating electric charges provided on the third insulator, a fourth insulator provided on the second charge accumulation film, and a second control gate provided on the fourth insulator;

a pass transistor comprising, a fourth diffusion region and a fifth diffusion region separately provided each other in the second semiconductor region, both the fourth diffusion region and the fifth diffusion region having the second conductive type, a fifth insulator provided on a third portion of the second semiconductor region between the fourth diffusion region and the fifth diffusion region, a gate electrode provided on the fifth insulator and connected to the second diffusion region; and a first substrate electrode provided on the semiconductor substrate applying a first substrate voltage to the second semiconductor region; wherein a writing voltage is applied to the first control gate and the second control gate, a first voltage is applied to one of the first diffusion region and the third diffusion region and a second voltage which is lower than the first voltage is applied to the other of the first diffusion region and the third diffusion region, and the first substrate voltage which is higher than the second voltage and lower than the first voltage is applied to the first substrate electrode, when data is written into the first memory cell transistor or the second memory cell transistor.

5. The nonvolatile programmable logic switch of claim 4, wherein the first semiconductor region and the second semiconductor region are provided in one well, and the first substrate electrode applies also the first substrate voltage to the first semiconductor region.

6. The nonvolatile programmable logic switch of claim 4, further comprising;

a first well provided on a substrate, the first semiconductor region being provided on the first well;

a second well provided on the substrate, the second well being different from the first well, the second semiconductor region being provided on the second well; and a second substrate electrode applying a second substrate voltage to the first semiconductor region.

7. The nonvolatile programmable logic switch of claim 6, wherein the first memory cell transistor and the second memory cell transistor are constituted with one of a MONOS type transistor and an SONOS type transistor.

8. The nonvolatile programmable logic switch of claim 2, wherein a voltage of 0V is applied to the first wiring, the second wiring and the third wiring are set to be in floating states, and a prescribed writing voltage is applied to the first substrate electrode so as to erase data in the first memory cell transistor and the second memory.

9. The nonvolatile programmable logic switch of claim 3, wherein a voltage of 0V is applied to the first wiring, the second wiring and the third wiring are set to be in floating states, a prescribed writing voltage is applied to the first substrate electrode, and the prescribed writing voltage is applied to the second substrate electrode so as to erase data in the first memory cell transistor and the second memory.

* * * * *

UNITED STATES PATENT AND TRADEMARK OFFICE
CERTIFICATE OF CORRECTION

| | | |
|---|---|---|
| PATENT NO. | : 8,553,464 B2 | Page 1 of 1 |
| APPLICATION NO. | : 13/240087 | |
| DATED | : October 8, 2013 | |
| INVENTOR(S) | : Nishi et al. | |

It is certified that error appears in the above-identified patent and that said Letters Patent is hereby corrected as shown below:

In the Claims:

Claim 3, column 12, line 35, change "comprising;" to --comprising:--.

Claim 4, column 12, line 51, change "separated each" to --separated from each--.

Claim 4, column 12, line 58, change "comprising;" to --comprising:--.

Claim 4, column 12, line 67, change "comprising;" to --comprising:--.

Claim 4, column 13, line 9, change "comprising;" to --comprising:--.

Claim 4, column 13, line 10-11, change "separately provided each other" to --separately provided from each other--.

Claim 6, column 14, line 6, change "comprising;" to --comprising:--.

Signed and Sealed this
Twenty-eighth Day of January, 2014

Michelle K. Lee
*Deputy Director of the United States Patent and Trademark Office*